(12) United States Patent
Du et al.

(10) Patent No.: US 12,356,803 B2
(45) Date of Patent: *Jul. 8, 2025

(54) DISPLAY SUBSTRATE HAVING PHOTO SPACER AND PIXEL DEFINING LAYER INCLUDING A PLURALITY OF OPENINGS AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Mengmeng Du, Beijing (CN); Xiangdan Dong, Beijing (CN); Qi Liu, Beijing (CN); Fan He, Beijing (CN); Bo Zhang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/591,771

(22) Filed: Feb. 29, 2024

(65) Prior Publication Data
US 2024/0206267 A1 Jun. 20, 2024

Related U.S. Application Data

(63) Continuation of application No. 16/977,866, filed as application No. PCT/CN2019/122156 on Nov. 29, 2019, now Pat. No. 11,974,473.

(51) Int. Cl.
*H10K 59/122* (2023.01)
*H10K 59/131* (2023.01)
(Continued)

(52) U.S. Cl.
CPC ........ *H10K 59/122* (2023.02); *H10K 59/131* (2023.02); *H10K 59/8723* (2023.02); *H10K 59/351* (2023.02); *H10K 59/353* (2023.02)

(58) Field of Classification Search
CPC .. H10K 59/131; H10K 59/351; H10K 59/353; H10K 59/122; H10K 50/8428
See application file for complete search history.

(56) References Cited

U.S. PATENT DOCUMENTS 9,711,585 B2 7/2017 Kim et al.
9,837,476 B2 12/2017 Park et al.
(Continued)

FOREIGN PATENT DOCUMENTS

CN 104124263 A 10/2014
CN 104282717 A 1/2015
(Continued)

OTHER PUBLICATIONS

Extended European Search Report from European Patent Application No. 19945420.8 dated Oct. 24, 2022.
(Continued)

*Primary Examiner* — Changhyun Yi
(74) *Attorney, Agent, or Firm* — Dilworth & Barrese, LLP.; Michael J. Musella, Esq.

(57) ABSTRACT

A display substrate, a manufacturing method thereof and a display device are provided. The display substrate includes a base substrate, a pixel defining layer and at least one photo spacer. The pixel defining layer is disposed on the base substrate and includes a plurality of openings, the at least one photo spacer is disposed on a side of the pixel defining layer away from the base substrate. A distance from any point at a bottom of the at least one photo spacer contacting the pixel defining layer to an upper edge of a side wall of the plurality of openings is greater than or equal to 5 μm.

20 Claims, 10 Drawing Sheets

(51) Int. Cl.
*H10K 59/35* (2023.01)
*H10K 59/80* (2023.01)

(56) References Cited

U.S. PATENT DOCUMENTS

| | | |
|---|---|---|
| 10,509,500 B2 | 12/2019 | Lai et al. |
| 10,535,726 B2 | 1/2020 | Wang et al. |
| 10,541,294 B2 | 1/2020 | Hong et al. |
| 10,566,402 B2 | 2/2020 | Cho et al. |
| 10,770,525 B2 | 9/2020 | Jiang et al. |
| 10,886,342 B2 | 1/2021 | Lu et al. |
| 10,901,314 B2 | 1/2021 | Ji |
| 11,437,457 B2 | 9/2022 | Yang et al. |
| 11,974,473 B2 * | 4/2024 | Du .................. H10K 59/8723 |
| 2001/0055828 A1 | 12/2001 | Kaneko et al. |
| 2014/0319479 A1 | 10/2014 | Park et al. |
| 2015/0008820 A1 | 1/2015 | Lee |
| 2015/0102303 A1 | 4/2015 | Kim et al. |
| 2015/0102319 A1 | 4/2015 | Jeon |
| 2015/0214284 A1 | 7/2015 | Kim |
| 2015/0261050 A1 | 9/2015 | Chen et al. |
| 2016/0155792 A1 | 6/2016 | Wang et al. |
| 2016/0190173 A1 | 6/2016 | Lee et al. |
| 2016/0225834 A1 | 8/2016 | Kim et al. |
| 2016/0225838 A1 | 8/2016 | Im |
| 2017/0025487 A1 | 1/2017 | Byun et al. |
| 2017/0053975 A1 | 2/2017 | Cho et al. |
| 2017/0263567 A1 | 9/2017 | Moon et al. |
| 2017/0331066 A1 | 11/2017 | Jeon |
| 2018/0277040 A1 | 9/2018 | Lee et al. |
| 2018/0331171 A1 | 11/2018 | Kim et al. |
| 2018/0342570 A1 | 11/2018 | Hong et al. |
| 2019/0027546 A1 | 1/2019 | Lee |
| 2019/0103455 A1 | 4/2019 | Song et al. |
| 2019/0131371 A1 | 5/2019 | Yi et al. |
| 2019/0140043 A1 | 5/2019 | Wang et al. |
| 2019/0196630 A1 | 6/2019 | Lai et al. |
| 2019/0280076 A1 | 9/2019 | Bang et al. |
| 2019/0355802 A1 | 11/2019 | Shim et al. |
| 2019/0393283 A1 | 12/2019 | Lu et al. |
| 2020/0043406 A1 | 2/2020 | Cha et al. |
| 2020/0058728 A1 | 2/2020 | Song et al. |
| 2020/0119114 A1 | 4/2020 | Kim et al. |
| 2020/0243600 A1 | 7/2020 | Tzeng et al. |
| 2020/0279898 A1 | 9/2020 | Duan et al. |
| 2020/0411611 A1 | 12/2020 | Liu et al. |
| 2021/0066642 A1 | 3/2021 | Lee et al. |
| 2021/0225974 A1 | 7/2021 | Zeng et al. |
| 2021/0343226 A1 | 11/2021 | Okabe et al. |

FOREIGN PATENT DOCUMENTS

| | | |
|---|---|---|
| CN | 105720071 A | 6/2016 |
| CN | 105938704 A | 9/2016 |
| CN | 106469745 A | 3/2017 |
| CN | 106910765 A | 6/2017 |
| CN | 110071158 A | 7/2018 |
| CN | 108563353 A | 9/2018 |
| CN | 108598136 A | 9/2018 |
| CN | 108922919 A | 11/2018 |
| CN | 108933155 A | 12/2018 |
| CN | 109119028 A | 1/2019 |
| CN | 109148522 A | 1/2019 |
| CN | 208335702 U | 1/2019 |
| CN | 109360851 A | 2/2019 |
| CN | 109378329 A | 2/2019 |
| CN | 109962096 A | 7/2019 |
| CN | 110246864 A | 9/2019 |
| CN | 110265458 A | 9/2019 |
| CN | 110503918 A | 11/2019 |
| EP | 2797134 A1 | 10/2014 |
| EP | 2830095 A2 | 1/2015 |
| EP | 3293767 A2 | 3/2018 |
| JP | 2018189965 A | 11/2018 |

OTHER PUBLICATIONS

Partial Supplementary European Search Report from European Patent Application No. 19945468.7 dated Nov. 3, 2022.
Extended European Search Report from European Patent Application No. 20892526.3 dated Jan. 3, 2023.
Japanese Office Action issued by the Japanese Patent Office (Japanese Application No. 2021-57003; Mailed: Oct. 3, 2023.
Non-final Office Action from U.S. Appl. No. 17/876,689 dated Jan. 5, 2023.
Extended European Search Report from European Patent Application No. 19945468.7 dated Mar. 10, 2023.
US Office Action from U.S. Appl. No. 17/255,686 dated Jan. 1, 2022.
US Office Action issued by the USPTO in U.S. Appl. No. 16/976,545; has an issue date of Aug. 11, 2023.
US Office Action issued by the USPTO in U.S. Appl. No. 17/876,689; has an issue date of Jun. 26, 2023.
Chinese Office Action in Application No. 201980002732.5 issued Jun. 26, 2023.
US Office Action issued by the USPTO in U.S. Appl. No. 16/977,866, has an issue date of Aug. 25, 2023.
Search Report and Written Opinion from International Application No. PCT/CN2019/122156 dated Nov. 29, 2019.
Search Report and Written Opinion from International Application No. PCT/CN2019/122201 dated Nov. 29, 2019.
Search Report and Written Opinion from International Application No. PCT/CN2019/122184 dated Nov. 29, 2019.
Search Report and Written Opinion from International Application No. PCT/CN2020/097124 dated Jun. 19, 2020.
US Office Action issued by the USPTO in U.S. Appl. No. 17/416,078, has an issue date of Dec. 29, 2023.

* cited by examiner

DISPLAY SUBSTRATE HAVING PHOTO SPACER AND PIXEL DEFINING LAYER INCLUDING A PLURALITY OF OPENINGS AND DISPLAY DEVICE

CROSS REFERENCE TO RELATED APPLICATIONS

This application is a continuation application of U.S. patent application Ser. No. 16/977,866, which is a national phase of International Application No. PCT/CN2019/122156, filed on Nov. 29, 2019. All the aforementioned patent applications are hereby incorporated by reference in their entireties.

TECHNICAL FIELD

An embodiment of the present disclosure relates to a display substrate, a manufacturing method thereof and a display device.

BACKGROUND

An Organic Light Emitting Diode (OLED) display panel has a series of advantages such as self-luminescence, high contrast, high definition, wide viewing angle, low power consumption, fast response speed, and low manufacturing cost, has become one of the key development directions of a new generation of display panels, and then has received more and more attention.

An organic light-emitting layer and other functional layers of the OLED display panel are usually prepared by evaporation and other methods through a fine metal mask (FMM). In the preparation process, the FMM is usually located at a certain distance from a display substrate, to prevent the FMM from scratching functional structures on the display substrate.

SUMMARY

At least one embodiment of the present disclosure provides a display substrate, the display substrate comprises: a base substrate; a pixel defining layer, disposed on the base substrate and including a plurality of openings; and at least one photo spacer, disposed on a side of the pixel defining layer away from the base substrate, and a distance from any point at a bottom of the at least one photo spacer contacting the pixel defining layer to an upper edge of a side wall of the plurality of openings is greater than or equal to 5 μm.

For example, the display substrate provided by at least one embodiment of the present disclosure further comprises a pixel circuit structure disposed between the base substrate and the pixel defining layer and including a first signal line and a second signal line which are parallel to each other, and a first orthographic projection of the at least one photo spacer on the base substrate is located between a second orthographic projection of the first signal line on the base substrate and a third orthographic projection of the second signal line on the base substrate.

For example, in the display substrate provided by at least one embodiment of the present disclosure, the first signal line is a light-emitting control signal line, and the second signal line is a reset signal line.

For example, in the display substrate provided by at least one embodiment of the present disclosure, a distance from a center of the first orthographic projection to a central axis of the second orthographic projection is greater than a distance from the center of the first orthographic projection to a central axis of the third orthographic projection.

For example, in the display substrate provided by at least one embodiment of the present disclosure, the at least one photo spacer includes a plurality of photo spacers arranged in a plurality of rows and a plurality of columns; the pixel circuit structure includes a plurality of pixel circuits arranged in a plurality of rows and a plurality of columns; each row of pixel circuits share one light-emitting control signal line and one reset signal line; and orthographic projections of one row of photo spacers is located between an orthographic projection of the light-emitting control signal line of one row of pixel circuits on the base substrate and an orthographic projection of the reset signal line of a next row of pixel circuits on the base substrate.

For example, in the display substrate provided by at least one embodiment of the present disclosure, in each row of pixel circuits, every four adjacent pixel circuits are correspondingly provided with one photo spacer.

For example, in the display substrate provided by at least one embodiment of the present disclosure, the at least one photo spacer includes a plurality of photo spacers arranged in a plurality of rows and a plurality of columns; and a plurality of photo spacers disposed in an odd row and a plurality of photo spacers disposed in an even row are shifted ½ pitch.

For example, in the display substrate provided by at least one embodiment of the present disclosure, the plurality of openings include a first opening for a blue subpixel, a second opening for a red subpixel, and a third opening for a green subpixel; and sizes of the first opening, the second opening and the third opening are reduced gradually.

For example, in the display substrate provided by at least one embodiment of the present disclosure, by taking one blue subpixel, one red subpixel and two green subpixels as one repeat unit, the display substrate comprises a plurality of repeat units arranged in a plurality of rows and a plurality of columns; each repeat unit is correspondingly provided with one photo spacer; in each repeat unit, the third openings of the two green subpixels are arranged along a row direction; the first opening of the blue subpixel and the third opening of the red subpixel are arranged along a column direction; and the photo spacer is surrounded by the third openings of the two green subpixels, the first opening of the blue subpixel, and the third opening of the red subpixel.

For example, in the display substrate provided by at least one embodiment of the present disclosure, a connecting line of centers of the third openings of the two green subpixels in each repeat unit runs through the photo spacer, and the connecting line is parallel to a length direction of the photo spacer.

For example, in the display substrate provided by at least one embodiment of the present disclosure, the length direction of the photo spacer is a horizontal display direction of the display substrate.

For example, in the display substrate provided by at least one embodiment of the present disclosure, an orthographic projection of the photo spacer on the base substrate is overlapped with an orthographic projection of a region in which a pixel circuit of the red subpixel is located on the base substrate.

For example, in the display substrate provided by at least one embodiment of the present disclosure, a height of the at least one photo spacer is 0.8 μm-1.5 μm.

For example, in the display substrate provided by at least one embodiment of the present disclosure, a shape of an orthographic projection of the at least one photo spacer on the base substrate is rectangle.

For example, in the display substrate provided by at least one embodiment of the present disclosure, a length of the rectangle is 20 μm-30 μm, and a width of the rectangle is 10 μm-16 μm.

For example, in the display substrate provided by at least one embodiment of the present disclosure, a material of the at least one photo spacer is polyimide.

At least one embodiment of the present disclosure provides a display substrate, the display substrate comprises: a base substrate; a pixel circuit structure, disposed on the base substrate and including a first signal line and a second signal line which are parallel to each other; a pixel defining layer, disposed on a side of the pixel circuit structure away from the base substrate and including a plurality of openings; and at least one photo spacer, disposed on a side of the pixel defining layer away from the base substrate, a first orthographic projection of the at least one photo spacer on the base substrate is located between a second orthographic projection of the first signal line on the base substrate and a third orthographic projection of the second signal line on the base substrate.

For example, in the display substrate provided by at least one embodiment of the present disclosure, the first signal line is a light-emitting control signal line, and the second signal line is a reset signal line.

For example, in the display substrate provided by at least one embodiment of the present disclosure, the pixel circuit structure also includes a power line, the power line includes a plurality of first portions and a plurality of second portions which are alternately connected; the plurality of first portions are parallel to each other, and an extension direction of the plurality of first portions is identical with an extension direction of the first signal line and the second signal line, an extension direction of the second portion is intersected with the extension direction of the first portion; and an orthographic projection of the first portion on the base substrate is partially overlapped with the first orthographic projection; and an orthographic projection of the second portion on the base substrate is partially overlapped with the first orthographic projection.

For example, in the display substrate provided by at least one embodiment of the present disclosure, the pixel circuit structure also includes a data line, an extension direction of the data line is perpendicular to the extension direction of the first signal line and the second signal line; and an orthographic projection of the data line on the base substrate is not overlapped with the first orthographic projection.

At least one embodiment of the present disclosure provides a display substrate, the display substrate comprises: a base substrate; a pixel defining layer, disposed on the base substrate and including a plurality of openings; and at least one photo spacer, disposed on a side of the pixel defining layer away from the base substrate, the plurality of openings include a first opening, a second opening and a third opening, and sizes of the first opening, the second opening and the third opening are reduced gradually; in a first direction, the first opening and the second opening are respectively disposed on two sides of the at least one photo spacer; and in a second direction perpendicular to the first direction, the third openings are disposed on two sides of the at least one photo spacer.

For example, in the display substrate provided by at least one embodiment of the present disclosure, a blue light-emitting layer is disposed in the first opening; a red light-emitting layer is disposed in the second opening; and a green light-emitting layer is disposed in the third opening.

For example, in the display substrate provided by at least one embodiment of the present disclosure, a shape of the first opening is a first square, a shape of the second opening is a second square, and a side length of the first square is greater than a side length of the second square; a shape of the third opening is rectangle, a long side of the rectangle is parallel to the side length of the first square of the first opening which is adjacent to the third opening, and a short side of the rectangle is parallel to the side length of the second square of the second opening which is adjacent to the third opening.

At least one embodiment of the present disclosure provides a display device, the display device comprises the display substrate as any mentioned above.

At least one embodiment of the present disclosure provides a method for manufacturing a display substrate, the method comprises: providing a base substrate; forming a pixel defining layer on the base substrate, the pixel defining layer including a plurality of openings; and forming at least one photo spacer on a side of the pixel defining layer away from the base substrate, a distance from any point at a bottom of the at least one photo spacer contacting the pixel defining layer to a side wall of an upper surface of the plurality of openings is greater than or equal to 5 μm.

For example, in the method for manufacturing a display substrate provided by at least one embodiment of the present disclosure, the forming the at least one photo spacer on a side of the pixel defining layer away from the base substrate includes: positioning a forming position of the at least one photo spacer, so that the distance from any point at the bottom of the formed at least one photo spacer contacting the pixel defining layer to the side wall of the upper surface of the plurality of openings is greater than or equal to 5 μm.

For example, the method for manufacturing a display substrate provided by at least one embodiment of the present disclosure further comprises: forming a pixel circuit structure between the base substrate and the pixel defining layer, the pixel circuit structure including a first signal line and a second signal line which are parallel to each other, the positioning the forming position of the at least one photo spacer includes: positioning positions of the first signal line and the second signal line; and positioning the forming position of the at least one photo spacer by taking the positions of the first signal line and the second signal line as reference, so that a first orthographic projection of the formed at least one photo spacer on the base substrate is located between a second orthographic projection of the first signal line on the base substrate and a third orthographic projection of the second signal line on the base substrate.

For example, in the method for manufacturing a display substrate provided by at least one embodiment of the present disclosure, the first signal line is a light-emitting control signal line, and the second signal line is a reset signal line.

For example, in the method for manufacturing a display substrate provided by at least one embodiment of the present disclosure, a material of the at least one photo spacer is polyimide; and the forming the at least one photo spacer includes: forming a polyimide material layer on a side of the pixel defining layer away from the base substrate; and forming the at least one photo spacer by performing exposure and development on the polyimide material layer via a mask.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1A:
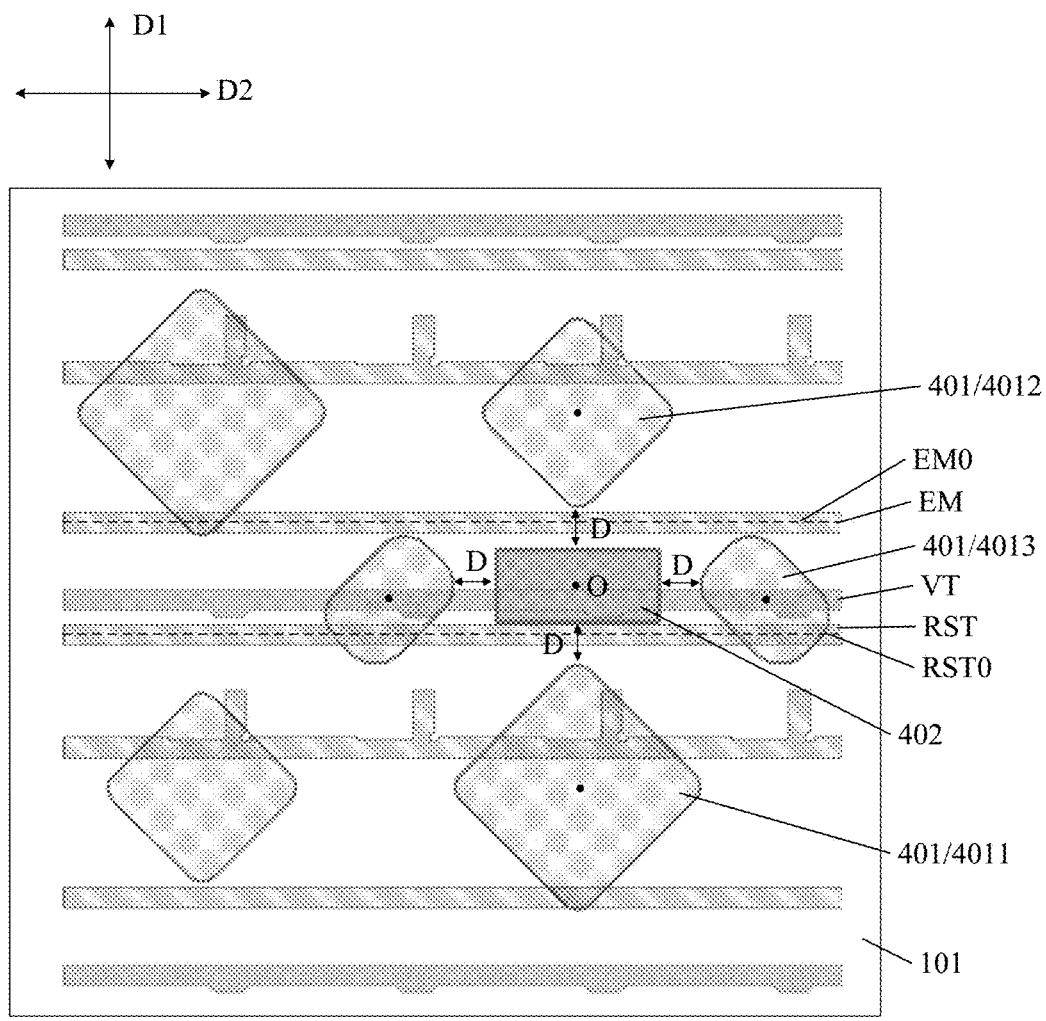
FIG. 1A is a schematic plan view of a display substrate provided by at least one embodiment of the present disclosure.

In the manufacturing process of the display substrate, functional layers such as an organic light-emitting layer are usually formed by evaporation and other means through an FMM. At this point, the FMM is usually locates at a certain distance from a display substrate to prevent the FMM from scratching functional layers on the display substrate. However, in the manufacturing process, a middle portion of the display substrate or the FMM will sink due to the reasons such as gravity, so that the distance between the display substrate and the FMM becomes smaller, and even the display substrate will contact the FMM. At this point, a photo spacer (PS) may be disposed on the display substrate to support the FMM, so as to prevent the FMM from contacting functional structures on the display substrate and scratching the functional structures on the display substrate. At this point, the setting position of the photo space, the structure of the photo space, and the like will affect the support effect of the photo space, and meanwhile, will affect the evaporation uniformity of evaporation material in the subsequent evaporation process.

At least one embodiment of the present disclosure provides a display substrate, a manufacturing method thereof and a display device. The display substrate comprises a base substrate, a pixel defining layer (PDL) and at least one photo spacer. The pixel defining layer is disposed on the base substrate and includes a plurality of openings. Each opening defines a light-emitting region of one subpixel. The at least one photo spacer is disposed at a side of the pixel defining layer away from the base substrate. On a surface at a side of the pixel defining layer away from the base substrate, a distance from any point at the bottom of the at least one photo spacer contacting the pixel defining layer to boundaries of the plurality of openings directly adjacent to the photo spacer is greater than or equal to 5 μm.

In the manufacturing process of the above display substrate, the photo spacer can support the FMM and isolate the FMM from the display substrate, so as to prevent the FMM from scratching the functional layers on the display substrate. In addition, a distance between the photo spacer and a boundary of the opening of the pixel defining layer is greater than or equal to 5 μm. As a deformed portion of the FMM or the display substrate when recessed is mainly located at a portion supported by the photo spacer and a portion away from the photo spacer is less deformed and more uniform, the bottom of the opening of the pixel defining layer is basically parallel to the FMM, and a big change in the parallel relationship between the bottom of the opening of the pixel defining layer and the FMM, due to the deformation such as the recession of the FMM or the display substrate between adjacent photo spacers, will not occur. Thus, a material evaporated to the openings of the pixel defining layer through the FMM is more uniform, and then the quality of the display substrate is improved.

Description will be given below to the display substrate, the manufacturing method thereof and the display device provided by some embodiments of the present disclosure with reference to several specific embodiments.

At least one embodiment of the present disclosure provides a display substrate. FIG. 1A is a schematic plan view of the display substrate. As shown in FIG. 1A, the display substrate comprises a base substrate 101, a pixel defining layer and at least one photo spacer 402. The pixel defining layer is disposed on the base substrate 101 and includes a plurality of openings 401. Light-emitting layers and the like for light-emitting elements are formed in the plurality of openings 401. At least one photo spacer 402 is disposed on a side of the pixel defining layer away from the base substrate 101. A distance D from any point at the bottom of the at least one photo spacer 402 contacting the pixel defining layer to upper edges (that is, edges on a side of side walls of the plurality of openings 401 away from the base substrate 101, or edges of the plurality of openings 401 on a surface of the pixel defining layer contacting the photo spacer 402) of the side walls of the plurality of openings 401 is greater than or equal to 5 μm.

For instance, as shown in FIG. 1A, the plurality of openings include a first opening 4011, a second opening 4012 and third opening 4013 with different sizes. The shortest distance D between the photo spacer 402 and the boundaries of the openings directly adjacent to the photo spacer, that is, the shortest distance D between any point at the bottom of the photo spacer 402 contacting the pixel defining layer and the boundaries of the plurality of openings 401 directly adjacent to the photo spacer, is greater than or equal to 5 μm.

For instance, in some embodiments, the display substrate includes a plurality of subpixels that can emit light of different colors (such as red, blue and green). As light-emitting layers that can emit light of different colors have different light-emitting efficiency and service life, the light-emitting layers that can emit light of different colors may be respectively formed in the openings with different sizes, so as to form the plurality of subpixels that can emit light of different colors. For instance, light-emitting layers of subpixels with low light-emitting efficiency or light-emitting layers of subpixels with a small number of openings are formed in openings with large size, and light-emitting layers of subpixels with high light-emitting efficiency or light-emitting layers of subpixels with a large number of openings are formed in openings with small size, so as to balance the light-emitting brightness of the subpixels of different colors.

For instance, in one example, a blue light-emitting layer, a red light-emitting layer and a green light-emitting layer may be respectively formed in the first opening 4011, the second opening 4012 and the third opening 4013 whose opening sizes sequentially decrease. Thus, the first opening 4011 is configured to form blue subpixel; the second opening 4012 is configured to form red subpixel; and the third opening 4013 is configured to form green subpixel, so as to balance the light-emitting brightness of the subpixels of different colors.

For instance, the photo spacer 102 is surrounded by the first opening 4011, the second opening 4012 and two third openings 4013. For instance, in some examples, as shown in FIG. 1A, in a first direction D1 (namely the vertical direction in FIG. 1A), the first opening 4011 and the second opening 4012 are respectively on two sides of the photo spacer 402; and in a second direction D2 perpendicular to the first direction D1 (namely the horizontal direction in FIG. 1A), the third openings 4013 are respectively on two sides of the photo spacer 402.

For instance, a shape of the first opening 4011 is a first square; a shape of the second opening 4012 is a second square; and a side length of the first square is greater than a side length of the second square. A shape of the third opening 4013 is rectangle; a long side of the rectangle is parallel to the side length of the first square of the adjacent first opening 4011; and a short side of the rectangle is parallel to the side length of the second square of the adjacent second opening 4012. For instance, in other embodiments, the shape of the first opening 4011 may also be replaced by a first circle; the shape of the second opening 4012 may also be replaced by a second circle; and the shape of third opening 4013 may also be replaced by an ellipse. At this point, a diameter of the first circle is greater than a diameter of the second circle; a straight line where a major axis of the ellipse is located runs through centers of two second openings 4012 adjacent to the ellipse; and a straight line where a short axis of the ellipse is located runs through centers of two first openings 4011 adjacent to the ellipse. Thus, distances from the photo spacer 402 to the plurality of openings, that is, the first opening 4011, the second opening 4012 and the third openings 4013, are substantially the same, so that the photo spacer has sufficient and uniform support function to the FMM on peripheries of the openings, and then materials evaporated to the openings via the FMM are more uniform.

It should be noted that the above opening 401 will be usually designed to be regular shape such as quadrangle, pentagon, hexagon, circle or ellipse. However, in actual manufacturing process, the shape of the formed opening 401 will generally deviate from the above designed regular shape. For instance, angles of the above regular shape may become rounded corners, so the shape of the opening 401 may be rounded corner pattern. In addition, the shape of the actually formed opening 401 may also have other changes to the designed shape. For instance, the shape of an effective light-emitting region that is designed to be rectangular may become approximately elliptical in actual manufacturing process. At this point, the above square or rectangle may become a rounded square or a rounded rectangle.

For instance, taking the first opening 4011, the second opening 4012 and the two third openings 4013 as one repeat unit, each repeat unit may be correspondingly provided with two photo spacers. At this point, each photo spacer is disposed between every two adjacent third openings 4013 on the display substrate, and a plurality of photo spacers are uniformly arranged as an array with a plurality of rows and a plurality of columns on the display substrate.

For instance, as shown in FIG. 1A, in each repeat unit, shapes of the two third openings 4013 are in mirror symmetry; a connecting line of centers of the two third openings 4013 runs through the photo spacer 402 between the two third openings; and a connecting line of apex angles of the two third openings 4013 closest to the photo spacer 402 also runs through the photo spacer 402 between the two third openings. For instance, a connecting line of a center of the first opening 4011 and a center of the second opening 4012 runs through the photo spacer 402, for example, runs through a center of the photo spacer 402, that is to say, the center of the first opening 4011, the center of the second opening 4012, and the center of the photo spacer 402 are located in one straight line. For instance, a length direction of the photo spacer 402 is parallel to a direction of the connecting line of the centers of the two third openings 4013, and a width direction of the photo spacer 402 is parallel to a direction of the connecting line of the center of the first opening 4011 and the center of the second opening 4012.

Figure 1B:
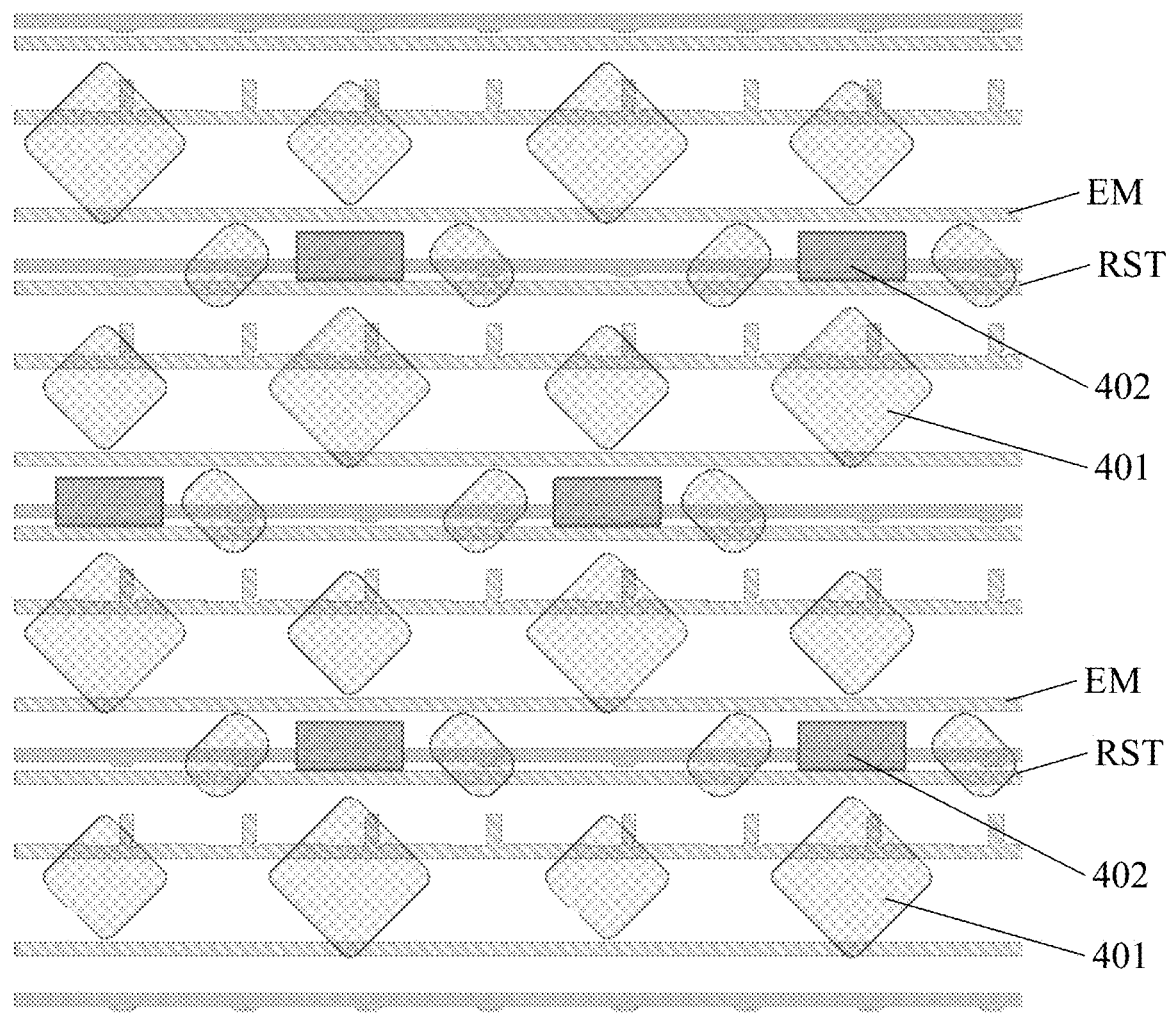
FIG. 1B is another schematic plan view of a display substrate provided by at least one embodiment of the present disclosure.

In some embodiments, each repeat unit may also be correspondingly provided with one photo spacer. At this point, as shown in FIG. 1B, the photo spacer 402 may be disposed between the two third openings 4013 of each repeat unit, and the plurality of photo spacers 402 are uniformly distributed on the display substrate in a staggered form. For instance, a photo spacer in an odd row and a photo spacer in an even row deviates ½ pitch, and one pitch refers to a distance between two adjacent photo spacers in each row of photo spacers. Or every two repeat units may also be correspondingly provided with one photo spacer. At this point, each photo spacer may be disposed between two third openings 4013 of repeat units spaced from each other. Or every four repeat units (the four repeat units are, for example, arranged in a 2×2 array) may also be correspondingly provided with one photo spacer. At this point, each photo spacer may be disposed between two third openings 4013 of repeat units at the same position in every four repeat units. In the above arrangement, the photo spacers can all show sufficient and uniform support effect.

For instance, the display substrate further comprises a pixel circuit structure which is disposed between the base substrate and the pixel defining layer. The pixel circuit structure includes first signal lines (e.g., EM lines as shown in FIG. 1A, with more details given later) and second signal lines (e.g., RST lines as shown in FIG. 1A, with more details given later) which are parallel to each other. A first orthographic projection of the at least one photo spacer 402 on the base substrate is located between a second orthographic projection of the first signal line on the base substrate and a third orthographic projection of the second signal line on the base substrate, that is, the first orthographic projection falls within the range defined by the second orthographic projection and the third orthographic projection.

For instance, in some examples, a distance from a center of the first orthographic projection to a central axis (e.g., EM0 line as shown in FIG. 1A) of the second orthographic projection is greater than a distance from the center of the first orthographic projection to a central axis (e.g., RST0 line as shown in FIG. 1A) of the third orthographic projection, that is, the at least one photo spacer 402 is closer to the second signal line between the first signal line and the second signal line.

For instance, the pixel circuit structure of the display substrate includes a pixel circuit for driving a plurality of subpixels to emit light, e.g., a 2T1C (namely including two thin-film transistors (TFTs) T and one storage capacitor C) pixel circuit, a 3T1C (namely including three thin-film transistors T and one storage capacitor C) pixel circuit, or a 7T1C (namely including seven thin-film transistors T and one storage capacitor C) pixel circuit. Two parallel signal lines in the driving circuit may be implemented as the above first signal line and the above second signal line. Description will be given below by taking the 7T1C driving circuit as an example.

Figure 2A:
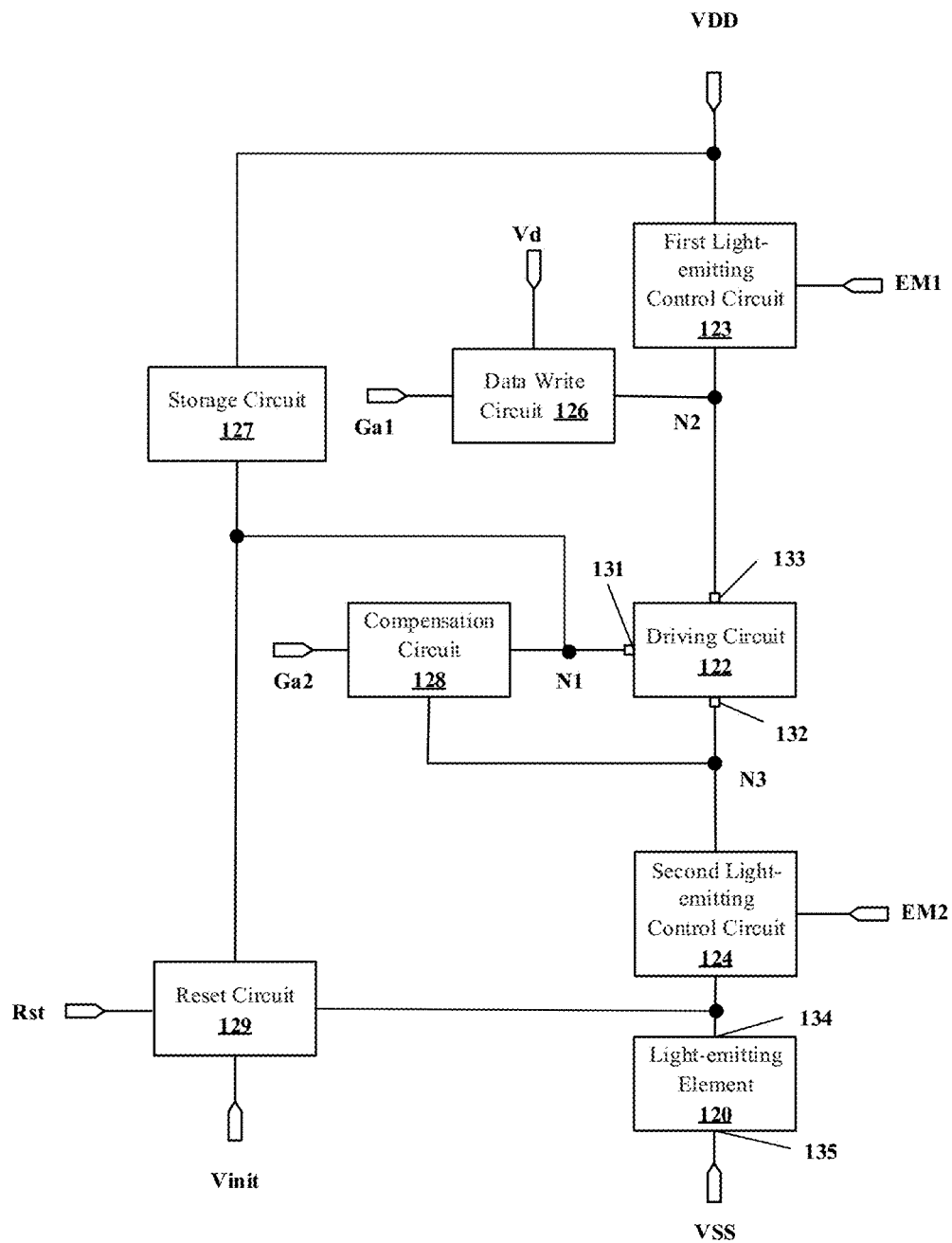
FIGS. 2A and 2B are circuit diagrams of a pixel circuit in a display substrate provided by at least one embodiment of the present disclosure.

For instance, FIG. 2A is a circuit diagram of a 7T1C pixel circuit. As shown in FIG. 2A, the pixel circuit includes a driving circuit 122, a data write circuit 126, a compensation circuit 128, a storage circuit 127, a first light-emitting control circuit 123, a second light-emitting control circuit 124 and a reset circuit 12.

For instance, the driving circuit 122 includes a control terminal 131, a first terminal 132 and a second terminal 133 and is configured to control the driving current flowing across a light-emitting element 120; the control terminal 131 of the driving circuit 122 is connected with a first node N1; the first terminal 132 of the driving circuit 122 is connected with a second node N2; and the second terminal 133 of the driving circuit 122 is connected with a third node N3.

For instance, the data write circuit 126 includes a control terminal, a first terminal and a second terminal; the control terminal is configured to receive a first scanning signal; the first terminal is configured to receive a data signal; and the second terminal is connected with the first terminal 132 (the second node N2) of the driving circuit 122 and is configured to write the data signal into the first terminal 132 of the driving circuit 122 in response to a first scanning signal Ga1. For instance, the first terminal of the data write circuit 126 is connected with a data line 12 to receive the data signal, and the control terminal is connected with a scanning line 11 to receive the first scanning signal Ga1.

For instance, in the data write phase, the data write circuit 126 may be switched on in response to the first scanning signal Ga1, so as to write the data signal into the first terminal 132 (the second node N2) of the driving circuit 122 and store the data signal into the storage circuit 127, thereby generating the driving current for driving the light-emitting element 120 to emit light according to the data signal in, for example, a light-emitting phase.

For instance, the compensation circuit 128 includes a control terminal, a first terminal and a second terminal; the control terminal is configured to receive a second scanning signal Ga2; the first terminal and the second terminal are respectively electrically connected with the control terminal 131 and the second terminal 133 of the driving circuit 122; and the compensation circuit is configured to perform threshold compensation on the driving circuit 120 in response to the second scanning signal.

For instance, the storage circuit 127 is electrically connected with the control terminal 131 of the driving circuit 122 and a first voltage terminal VDD and is configured to store the data signal written by the data write circuit 126. For instance, in a data write and compensation phase, the compensation circuit 128 may be switched on in response to the second scanning signal Ga2 and then may store the data signal written by the data write circuit 126 into the storage circuit 127. For instance, in the data write and compensation phase, the compensation circuit 128 may also be electrically connected with the control terminal 131 and the second terminal 133 of the driving circuit 122, so that relevant information of a threshold voltage of the driving circuit 122 may also be correspondingly stored in the storage circuit. Thus, the driving circuit 122 may be controlled by utilization of the stored data signal and the threshold voltage in, for example, the light-emitting phase, so that an output of the driving circuit 122 can be compensated.

For instance, the first light-emitting control circuit 123 is connected with the first terminal 132 (the second node N2) of the driving circuit 122 and the first voltage terminal VDD and is configured to apply the first supply voltage of the first voltage terminal VDD to the first terminal 132 of the driving circuit 122 in response to a first light-emitting control signal. For instance, as shown in FIG. 2A, the first light-emitting control circuit 123 is connected with a first light-emitting control terminal EM1, the first voltage terminal VDD and the second node N2.

For instance, the second light-emitting control circuit 124 is connected with a second light-emitting control terminal EM2, a first terminal 510 of the light-emitting element 120, and the second terminal 132 of the driving circuit 122, and is configured to apply the driving current to the light-emitting element 120 in response to a second light-emitting control signal.

For instance, in the light-emitting phase, the second light-emitting control circuit 124 is switched on in response to the second light-emitting control signal provided by the second light-emitting control terminal EM2, so that the driving circuit 122 can apply the driving current to the light-emitting element 120 through the second light-emitting control circuit 124 to allow the light-emitting element to emit light. In the non-light-emitting phase, the second light-emitting control circuit 124 is switched off in response to the second light-emitting control signal, so as to avoid the current from flowing across the light-emitting element 120 to drive the light-emitting element to emit light, and then the contrast of corresponding display device can be improved.

Moreover, for instance, in an initialization phase, the second light-emitting control circuit 124 may also be switched on in response to the second light-emitting control signal, so as to be combined with a reset circuit to perform the reset operation on the driving circuit 122 and the light-emitting element 120.

For instance, the second light-emitting control signal EM2 and the first light-emitting control signal EM1 may be the same or different. For example, both may be connected to the same or different signal output terminals.

For instance, a reset circuit 129 is connected with a reset voltage terminal Vinit and a first terminal 134 (a fourth node N4) of the light-emitting element 120 and is configured to apply a reset voltage to the first terminal 134 of the light-emitting element 120 in response to a reset signal. In some other examples, as shown in FIG. 2A, the reset signal may also be applied to the control terminal 131 of the driving circuit, namely the first node N1. For instance, the reset signal is the second scanning signal and may also be other signals synchronous with the second scanning signal. No limitation will be given here in the embodiment of the present disclosure. For instance, as shown in FIG. 2A, the reset circuit 129 is respectively connected with the first terminal 134 of the light-emitting element 120, the reset voltage terminal Vinit and a reset control terminal Rst (a reset control line). For instance, in the initialization phase, the reset circuit 129 may be switched on in response to the reset signal, so as to apply the reset voltage to the first terminal 134 of the light-emitting element 120 and the first node N1, thereby performing reset operation on the driving circuit 122, the compensation circuit 128 and the light-emitting element 120, and finally eliminating the effect of the previous light-emitting phase.

For instance, the light-emitting element 120 includes the first terminal 134 and a second terminal 135; the first terminal 134 of the light-emitting element 120 is configured to receive the driving current from the second terminal 133 of the driving circuit 122; and the second terminal 135 of the light-emitting element 120 is configured to be connected with a second voltage terminal VSS. For instance, in one example, as shown in FIG. 2A, the first terminal 134 of the light-emitting element 120 may be connected to the third node N3 through the second light-emitting control circuit 124. The embodiment of the present disclosure includes but not limited to this case. For instance, the light-emitting element 120 may be various types of OLEDs, e.g., top-emission, bottom-emission or double-sided emission, and may emit red light, green light, blue light, white light, etc. A first electrode and a second electrode of the OLED are respectively taken as the first terminal 134 and the second terminal 135 of the light-emitting element. No limitation will be given to the specific structure of the light-emitting element in the embodiment of the present disclosure.

It should be noted that in the description of the embodiment of the present disclosure, the first node N1, the second node N2, the third node N3 and the fourth node N4 are not necessarily actual components but indicate the junctions of related circuit connections in the circuit diagram.

It should be noted that in the description of the embodiment of the present disclosure, a symbol Vd not only may indicate a data signal terminal but also may indicate a level of the data signal. Similarly, symbols Ga1 and Ga2 not only may indicate the first scanning signal and the second scanning signal but also may indicate the first scanning signal terminal and the second scanning signal terminal; Rst not only may indicate a reset control terminal but also may indicate a reset signal; a symbol Vinit not only may indicate the reset voltage terminal but also may indicate the reset voltage; a symbol VDD not only may indicate the first voltage terminal but also may indicate the first supply voltage; and a symbol VSS not only may indicate the second voltage terminal but also may indicate the second supply voltage. The following embodiments are the same with the embodiment, so no further description will be given here.

Figure 2B:
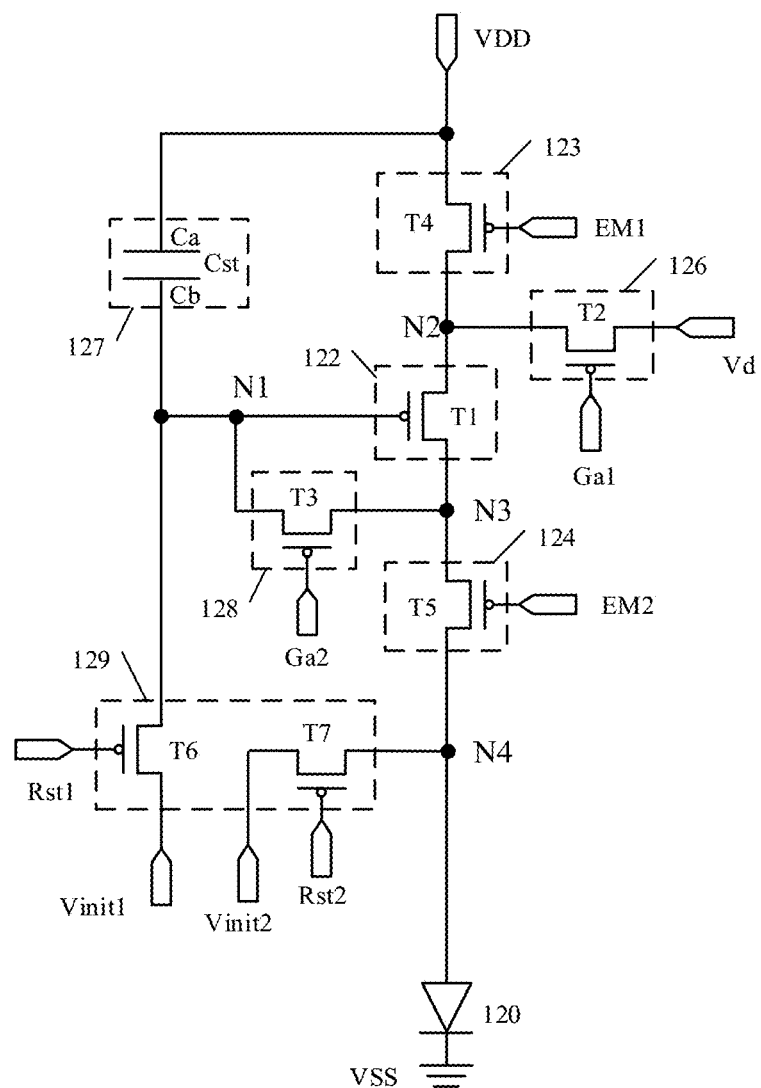

FIG. 2B is a circuit diagram of a specific implementation example of the pixel circuit as shown in FIG. 2A. As shown in FIG. 2B, the pixel circuit includes: first to seventh transistors T1, T2, T3, T4, T5, T6 and T7 and a storage capacitor Cst. For instance, the first transistor T1 is used as a driving transistor, and the other second to seventh transistors are used as switching transistors.

For instance, as shown in FIG. 2B, the driving circuit 122 may be implemented as the first transistor T1. A gate electrode of the first transistor T1 is taken as the control terminal 131 of the driving circuit 122 and is connected with the first node N1; a first electrode of the first transistor T1 is taken as the first terminal 132 of the driving circuit 122 and is connected with the second node N2; and a second electrode of the first transistor T1 is taken as the second terminal 133 of the driving circuit 122 and is connected with the third node N3.

For instance, as shown in FIG. 2B, the data write circuit 126 may be implemented as the second transistor T2. A gate electrode of the second transistor T2 is connected with the first scanning line (the first scanning signal terminal Ga1) to receive the first scanning signal; a first electrode of the second transistor T2 is connected with the data line (the data signal terminal Vd) to receive the data signal; and a second electrode of the second transistor T2 is connected with the first terminal 132 of the driving circuit 122 (the second node N2). For instance, the second transistor T2 is a P-type transistor. For example, an active layer is a low-temperature doped polysilicon TFT.

For instance, as shown in FIG. 2B, the compensation circuit 128 may be implemented as the third transistor T3. A gate electrode of the third transistor T3 is configured to be connected with the second scanning line (the second scanning signal terminal Ga2) to receive the second scanning signal; a first electrode of the third transistor T3 is connected with the control terminal 131 of the driving circuit 122 (the first node N1); and a second electrode of the third transistor T3 is connected with the second terminal 133 of the driving circuit 122 (the third node N3).

For instance, as shown in FIG. 2B, the storage circuit 127 may be implemented as the storage capacitor Cst. The storage capacitor Cst includes a first capacitor electrode Ca and a second capacitor electrode Cb. The first capacitor electrode Ca is connected with the first voltage terminal VDD. The second capacitor electrode Cb is connected with the control terminal 131 of the driving circuit 122.

For instance, as shown in FIG. 2B, the first light-emitting control circuit 123 may be implemented as the fourth transistor T4. A gate electrode of the fourth transistor T4 is connected with the first light-emitting control line (the first light-emitting control terminal EM1) to receive the first light-emitting control signal; a first electrode of the fourth transistor T4 is connected with the first voltage terminal VDD to receive the first supply voltage; and a second electrode of the fourth transistor T4 is connected with the first terminal 132 of the driving circuit 122 (the second node N2).

For instance, the light-emitting element 120 may be implemented as an OLED; the first electrode 134 (an anode here) of the light-emitting element 120 is connected with the fourth node N4 and is configured to receive the driving current from the second terminal 133 of the driving circuit 122 through the second light-emitting control circuit 124; and the second electrode 135 (a cathode here) of the light-emitting element 120 is configured to be connected with the second voltage terminal VSS to receive the second supply voltage. For instance, the second voltage terminal may be grounded, that is, VSS may be 0V.

For instance, the second light-emitting control circuit 124 may be implemented as the fifth transistor T5. A gate electrode of the fifth transistor T5 is connected with the second light-emitting control line (the second light-emitting control terminal EM2) to receive the second light-emitting control signal; a first electrode of the fifth transistor T5 is connected with the second terminal 133 of the driving circuit 122 (the third node N3); and a second electrode of the fifth transistor T5 is connected with the first terminal 134 of the light-emitting element 120 (the fourth node N4).

For instance, the reset circuit 129 may include a first reset circuit and a second reset circuit. The first reset circuit is configured to apply a first reset voltage Vini1 to the first node N1 in response to a first reset signal Rst1. The second reset circuit is configured to apply a second reset voltage Vini2 to the fourth node N4 in response to a second reset signal Rst2. For instance, as shown in FIG. 2B, the first reset circuit is implemented as the sixth transistor T6, and the second reset circuit is implemented as the seventh transistor T7. A gate electrode of the sixth transistor T6 is configured to be connected with the first reset control terminal Rst1 to receive the first reset signal Rst1; a first electrode of the sixth transistor T6 is connected with the first reset voltage terminal Vinit to receive the first reset voltage Vinit1; and a second electrode of the sixth transistor T6 is configured to be connected with the first node N1. A gate electrode of the seventh transistor T7 is configured to be connected with the second reset control terminal Rst2 to receive the second reset signal Rst2; a first electrode of the seventh transistor T7 is connected with the second reset voltage terminal Vinit2 to receive the second reset voltage Vinit2; and a second electrode of the seventh transistor T7 is configured to be connected with the fourth node N4.

It should be noted that the transistors adopted in the embodiment of the present disclosure may all be thin-film transistors or field-effect transistors (FETs) or other switching elements with the same characteristics. Description is given in the embodiment of the present disclosure by taking the TFT as an example. A source electrode and a drain electrode of the transistor adopted here may be symmetrical in structure, so the source electrode and the drain electrode have no difference in structure. In the embodiment of the present disclosure, in order to distinguish two electrodes except the gate electrode of the transistor, one electrode is directly described as the first electrode and the other electrode is directly described as the second electrode.

For instance, as shown in FIG. 1A, the first signal line is the light-emitting control line EM and is configured to transmit the first light-emitting control signal and the second light-emitting control signal; and the second signal line is the reset control line RST and is configured to transmit the first reset signal Rst1 and the second reset signal Rst2. Thus, a first orthographic projection of the photo spacer 402 on the base substrate 101 is located between a second orthographic projection of the light-emitting control line EM on the base substrate 101 and a third orthographic projection of the reset control line RST on the base substrate 101, for example, being closer to the third orthographic projection.

For instance, in FIG. 1A, a reset voltage line VT is disposed between the light-emitting control line EM and the reset control line RST and is configured to transmit the first reset voltage Vinit1 and the second reset voltage Vinit2. For instance, an orthographic projection of the photo spacer 402 on the base substrate 101 is partially overlapped with an orthographic projection of the above reset voltage line VT on the base substrate 101.

The layout of the above pixel circuit will be described in detail below.

Figure 3:
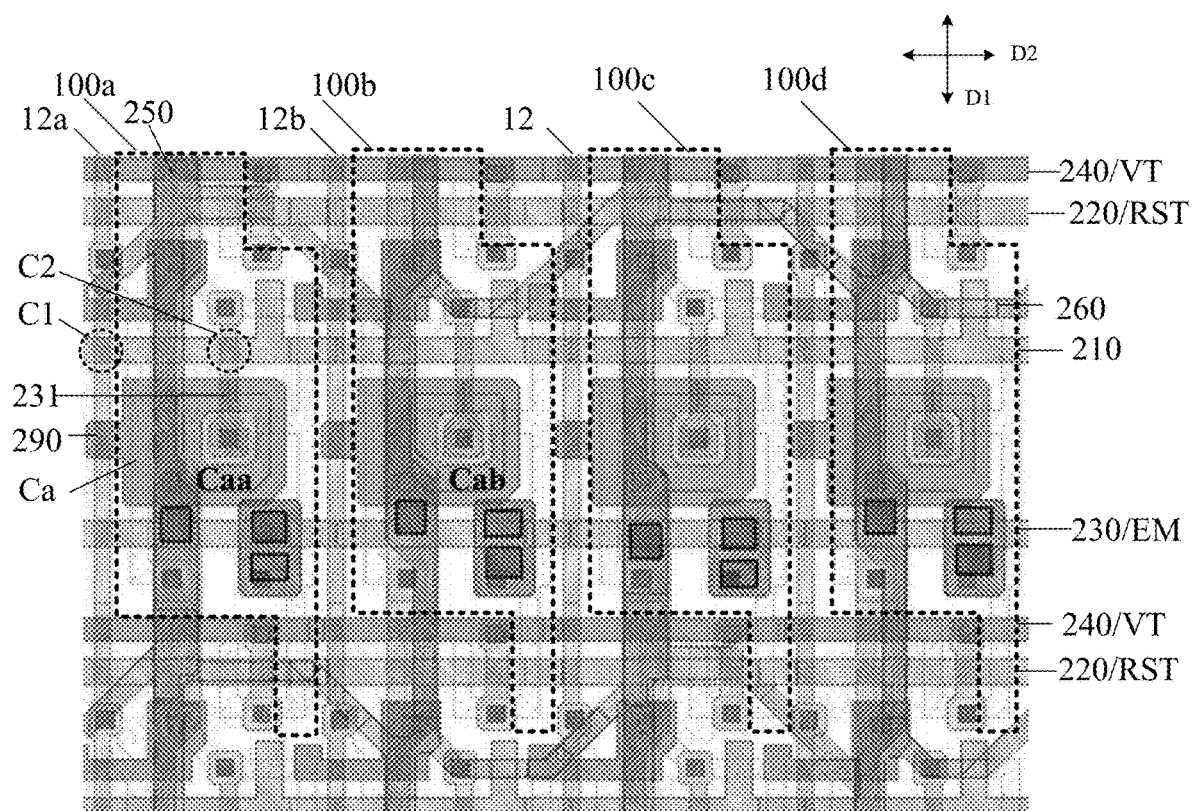
FIG. 3 is a schematic plan view of a display substrate provided by at least one embodiment of the present disclosure.

FIG. 3 is a schematic plan view of a display substrate provided by at least one embodiment of the present disclosure. The display substrate comprises a base substrate 101, and a plurality of subpixels 100 are disposed on the base substrate 101 and are arranged in an array on the base substrate 101 along a row direction (namely a transverse direction in the figure) and a column direction (namely a longitudinal direction in the figure). The column direction of the subpixel array is set to be a first direction D1, and the row direction is a second direction D2. The first direction DD1 is intersected with the second direction D2, for example, in orthogonal intersection with the second direction D2. FIG. 3 illustratively shows pixel circuits of directly adjacent four subpixels (that is, a first subpixel 100a, a second subpixel 100b, a third subpixel 100c and a fourth subpixel 100d) in one row of pixel circuits, and dotted frames show regions in which the pixel circuits of the subpixels are located. The embodiment of the present disclosure is not limited to the layout.

Figure 4A:
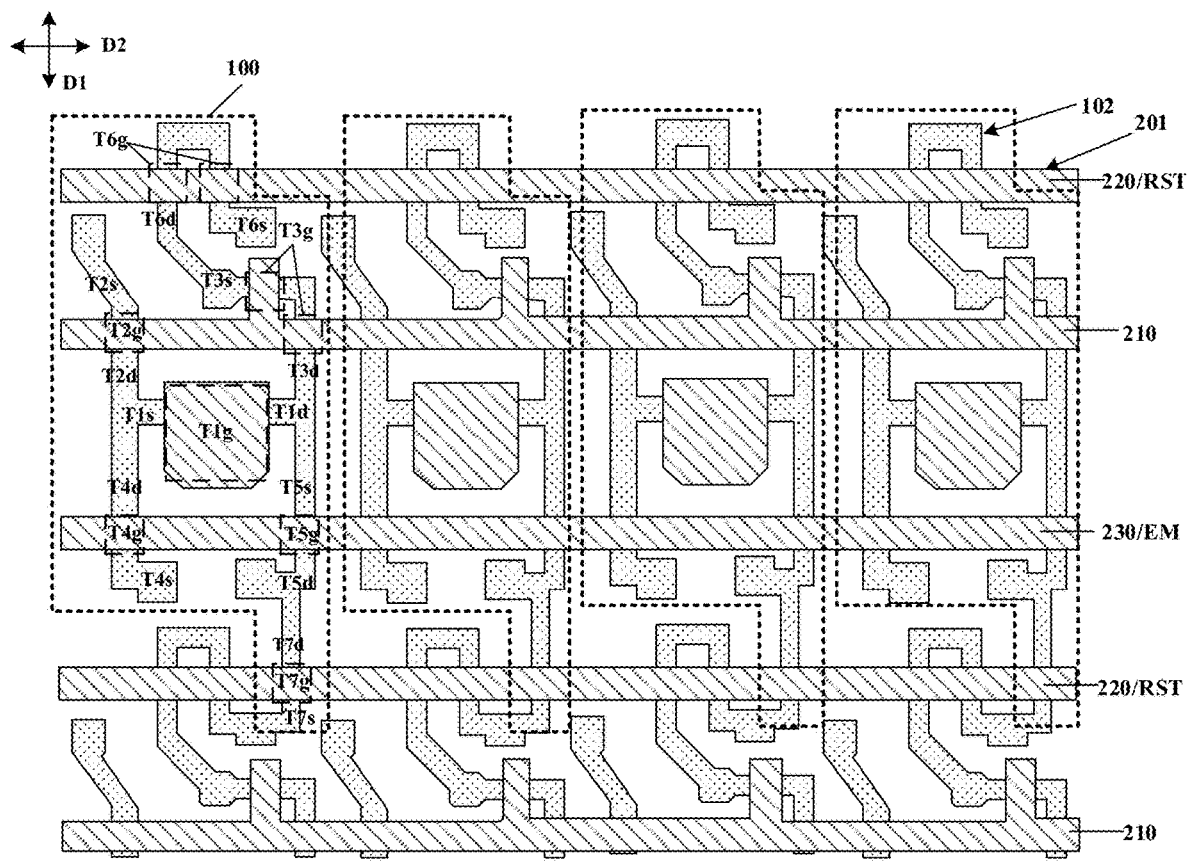
FIG. 4A, FIG. 4B, FIG. 4C, FIG. 4D and FIG. 4E are schematic plan views of a portion of functional layers in a pixel circuit structure of a display substrate provided by at least one embodiment of the present disclosure
Figure 4B:
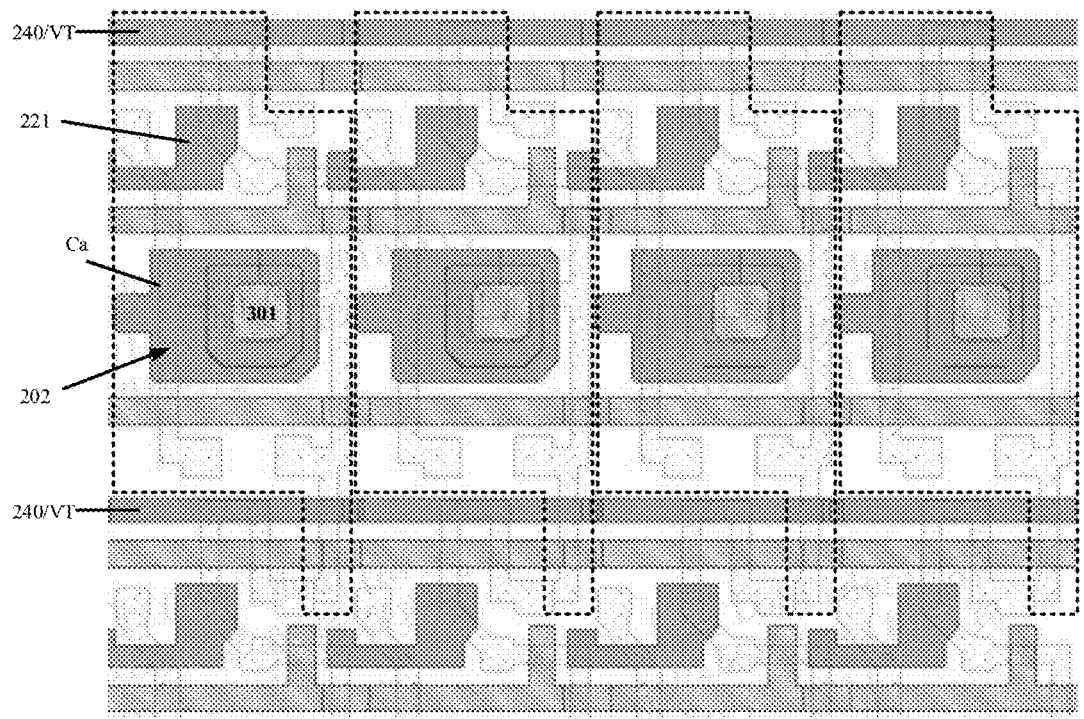
Figure 4C:
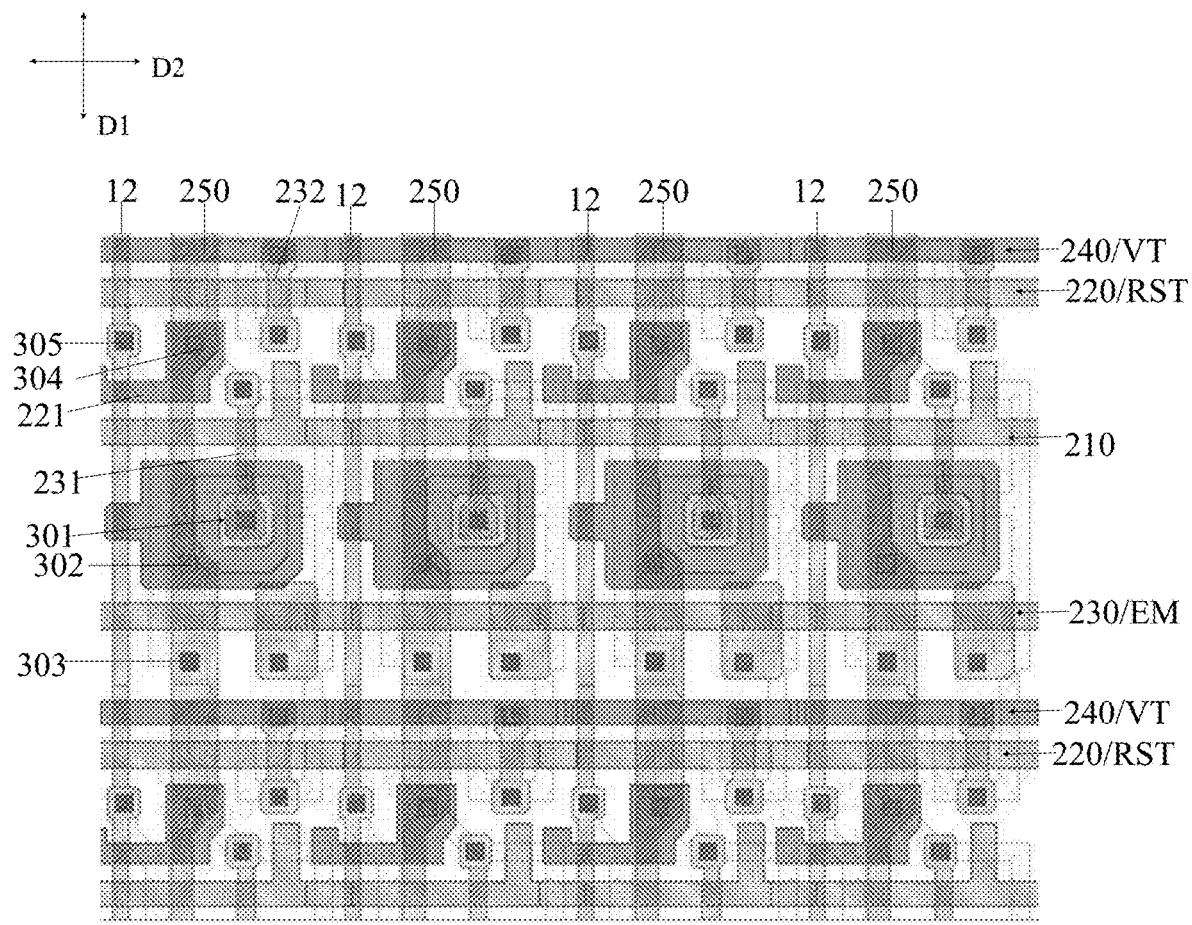
Figure 4D:
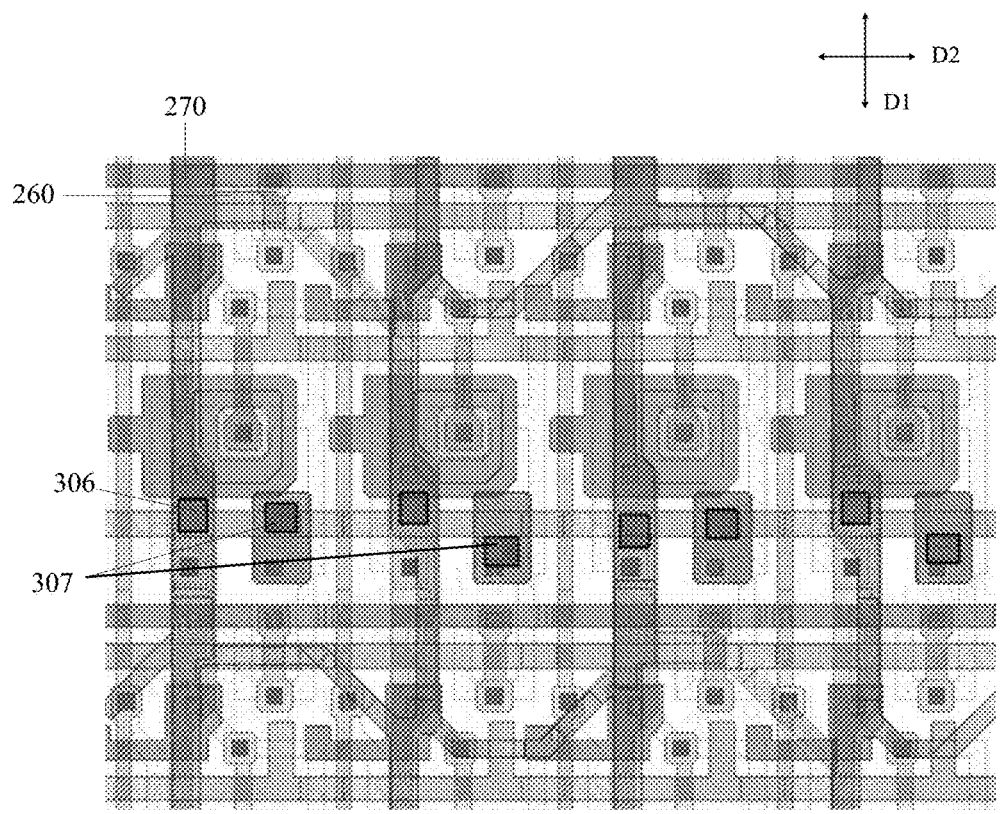

FIG. 4A shows a semiconductor layer 102 and a first conductive layer (a gate layer) 201 of transistors T1-T7 in the four subpixels 100 corresponding to FIG. 3. FIG. 4B also shows a second conductive layer 202 on the basis of FIG. 4A. FIG. 4C also shows a third conductive layer 203 on the basis of FIG. 4B. FIG. 4D also shows a fourth conductive layer 204 on the basis of FIG. 4C. It should be noted that the figure only illustratively shows corresponding structures of four adjacent subpixels in one row of subpixels, but should not be construed as the limitation of the present disclosure. The semiconductor layer 102, the first conductive layer 201, the second conductive layer 202, the third conductive layer 203 and the fourth conductive layer 204 are sequentially disposed on the base substrate 101, so as to form the structure of the display substrate as shown in FIG. 3.

For convenient description, Tng, Tns, Tnd and Tna are used to respectively indicate a gate electrode, a first electrode, a second electrode and an active layer of the nth transistor Tn in the following description, wherein n is 1-7.

It should be noted that "arranged in the same layer" in the present disclosure indicates that two (or more than two) structures are structures formed by the same deposition process and patterned by the same patterning process, and materials thereof may be the same or different. The "integral structure" in the present disclosure indicates that two (or more than two) structures are connected structures formed by the same deposition process and patterned by the same patterning process, and the materials thereof may be the same or different.

For instance, as shown in FIG. 4A, the first conductive layer 201 includes a gate electrode of each transistor and some scanning lines and control lines. In FIG. 4A, a large dotted frame shows a region in which a pixel circuit of each subpixel 100 is located, and small dotted frames show gate electrodes T1g-T7g of the first to seventh transistors T1-T7 in one subpixel 100.

The semiconductor layer 102 includes active layers T1a-T7a of the first to seventh transistors T1-T7. As shown in FIG. 3A, the active layers T1a-T7a of the first to seventh transistors T1-T7 are integrally connected structures. For instance, the semiconductor layers 20 in each column of subpixels are integrally connected structures, and the semiconductor layers in two adjacent columns of subpixels are spaced from each other.

For instance, as shown in FIG. 4A, the first conductive layer 104 includes the gate electrodes T1g-T7g of the first to seventh transistors T1-T7. For instance, the third transistor T3 and the sixth transistor T6 adopt double-gate structure, so as to improve the gate control ability of the transistor and reduce the leak current.

For instance, the first conductive layer 104 also includes a plurality of scanning lines 210, a plurality of reset control lines 220/RST, and a plurality of light-emitting control lines 230/EM which are insulated from each other. For instance, each row of subpixels are respectively and correspondingly connected with one scanning line 210, one reset control line 220/RST and one light-emitting control line 230/EM.

The scanning line 210 is electrically connected with the gate electrode of the second transistor T2 in one corresponding row of subpixels (or be an integral structure) to provide the first scanning signal Ga1; the reset control line 220/RST is electrically connected with the gate electrode of the sixth transistor T6 in one corresponding row of subpixels to provide the first reset signal Rst1; and the light-emitting control line 230/EM is electrically connected with the gate electrode of the fourth transistor T4 in one corresponding row of subpixels to provide the first light-emitting control signal EM1.

For instance, as shown in FIG. 4A, the scanning line 210 is also electrically connected with the gate electrode of the third transistor T3 to provide the second scanning signal Ga2; and the light-emitting control line 230/EM is also electrically connected with the gate electrode of the fifth transistor T5 to provide the second light-emitting control signal EM2, that is, the first light-emitting control signal EM1 and the second light-emitting control signal EM2 are the same signal.

For instance, as shown in FIG. 4A, the gate electrode of the seventh transistor T7 in this row of subpixels is electrically connected with a corresponding reset control line 220/RST of the next row of subpixels to receive the second reset signal Rst2.

For instance, as shown in FIG. 4A, a line of the row direction that divides the pixel circuit region of the subpixel may be the reset control line 220/RST or the light-emitting control line 230/EM.

For instance, as shown in FIG. 4A, the display substrate 20 adopts self-aligned process and utilizes the first conductive layer 201 as a mask for conduction treatment (e.g., doped treatment) on the semiconductor layer 102, so that a portion of the semiconductor layer 102 not covered by the first conductive layer 201 is conducted, and then portions of the active layer of the transistor, disposed on two sides of a channel region, are conducted to respectively form the first electrode and the second electrode of the transistor.

For instance, as shown in FIG. 4B, the second conductive layer 202 includes a first capacitor electrode Ca of the first to seventh transistors T1-T7. The first capacitor electrode Ca is overlapped with the gate electrode T1g of the first transistor T1 in a direction perpendicular to the base substrate 101 to form a storage capacitor Cst, that is, the gate electrode T1g of the first transistor T1 serves as a second capacitor electrode Cb of the storage capacitor Cst. For instance, the first capacitor electrode Ca includes a through hole 301. The through hole 301 exposes at least one portion of the gate electrode T1g of the first transistor T1, so as to make the gate electrode T1g easily to be connected with other structures.

For instance, the second conductive layer 202 may also include a plurality of reset voltage lines 240/VT. The plurality of reset voltage lines 240/VT are connected with a plurality of rows of subpixels in one-to-one correspondence relationship. The reset voltage line 240/VT is electrically connected with the first electrode of the sixth transistor T6 in one corresponding row of subpixels to provide the first reset voltage Vinit1.

For instance, as shown in FIG. 4B, the first electrode of the seventh transistor T7 in this row of subpixels is electrically connected with the reset voltage line 240/VT corresponding to the next row of subpixels to receive the second reset voltage Vinit2.

For instance, as shown in FIG. 4B, the second conductive layer 202 may also include a shielding electrode 221. The shielding electrode 221 is overlapped with the first electrode T2s of the second transistor T2 in the direction perpendicular to the base substrate 101 so as to protect a signal in the first electrode T2s of the second transistor T2 from being interfered by other signals. As the first electrode T2s of the second transistor T2 is configured to receive a data signal Vd and the data signal Vd determines the display grayscale of the subpixel, the shielding electrode 221 improves the stability of the data signal and then improves the display performance.

For instance, as shown in FIG. 4C, the third conductive layer 203 includes a plurality of first power lines 250 extended along the first direction D1. For instance, the plurality of first power lines 250 are electrically connected with a plurality of columns of subpixels in one-to-one correspondence to provide the first supply voltage VDD. The first power line 250 is electrically connected with the first capacitor electrode Ca in one corresponding column of subpixels through a through hole 302 and is electrically connected with the first electrode of the fourth transistor T4 through a through hole 303. For instance, the first power line 250 is also electrically connected with the shielding electrode 221 through a through hole 304, so that the shielding electrode 221 has fixed potential, and then the shielding capability of the shielding electrode is improved.

For instance, the third conductive layer 203 also includes a plurality of data lines 12. The plurality of data lines 12 are electrically connected with the plurality of columns of subpixels in one-to-one correspondence to provide the data signal. For instance, the data line 12 is electrically connected with the first electrode T2s of the second transistor T2 in one corresponding column of subpixels through a through hole 305 to provide the data signal.

For instance, as shown in FIG. 4C, the third conductive layer 203 also includes a first connecting electrode 231. One terminal of the first connecting electrode 231 is electrically connected with the gate electrode T1g of the first transistor T1, namely the second capacitor electrode Cb, through the through hole 301, and the other terminal is electrically connected with the first electrode of the third transistor T3, so that the second capacitor electrode Cb is electrically connected with the first electrode T3s of the third transistor T3.

For instance, as shown in FIG. 4C, the third conductive layer 203 also includes a second connecting electrode 232. Two terminals of the second connecting electrodes 232 are respectively electrically connected with the first electrode T6s of the sixth transistor T6 and the reset voltage line 240/VT, so that the first electrode T6s of the sixth transistor T6 may receive the first reset voltage Vinit1 from the reset voltage line 240/VT.

For instance, as shown in FIG. 4C, the third conductive layer 203 also includes a third connecting electrode 233. The third connecting electrode 233 is electrically connected with the second electrode T5d of the fifth transistor T5 and is configured to allow the second electrode T5d of the fifth transistor T5 to be electrically connected with the first electrode 134 of the light-emitting element, which will be explained in detail later.

For instance, as shown in FIG. 4D, the fourth conductive layer 204 includes a second power line 260. The second power line 260 is extended along the second direction D2 and configured to electrically connect the plurality of first power lines 240 to form a meshed power line structure. This structure helps to reduce the resistance on the power line so as to reduce the voltage drop of the power line, and helps to uniformly transmit the first supply voltage to the subpixels of the display substrate.

For instance, the fourth conductive layer 204 also includes a plurality of third power lines 270. The third power lines 270 are extended along the first direction D1 and are electrically connected with the plurality of first power lines 250 in one-to-one correspondence. As shown in FIG. 3D, the third power line 270 and a corresponding first power line 250 are overlapped with each other in the direction perpendicular to the base substrate 101 and electrically connected with each other through a through hole 306. For instance, one through hole 306 is respectively and correspondingly formed for each subpixel, so that each third power line 270 and a corresponding first power line 250 form a parallel structure, thereby helping to reduce the resistance of the power line.

For instance, the second power line 260 and the third power line 270 are electrically connected with each other to form an integral structure, so the plurality of first power lines 250, the plurality of second power lines 260, and the plurality of third power lines 270 form a meshed power line structure.

For instance, the fourth conductive layer 204 also includes a fourth connecting electrode 234 insulated from the third power line 270. The fourth connecting electrode 234 is electrically connected with the third connecting electrode 233 through a through hole 307, so as to allow the second electrode T5d of the fifth transistor T5 to be electrically connected with the first electrode 134 of the light-emitting element.

Figure 4E:
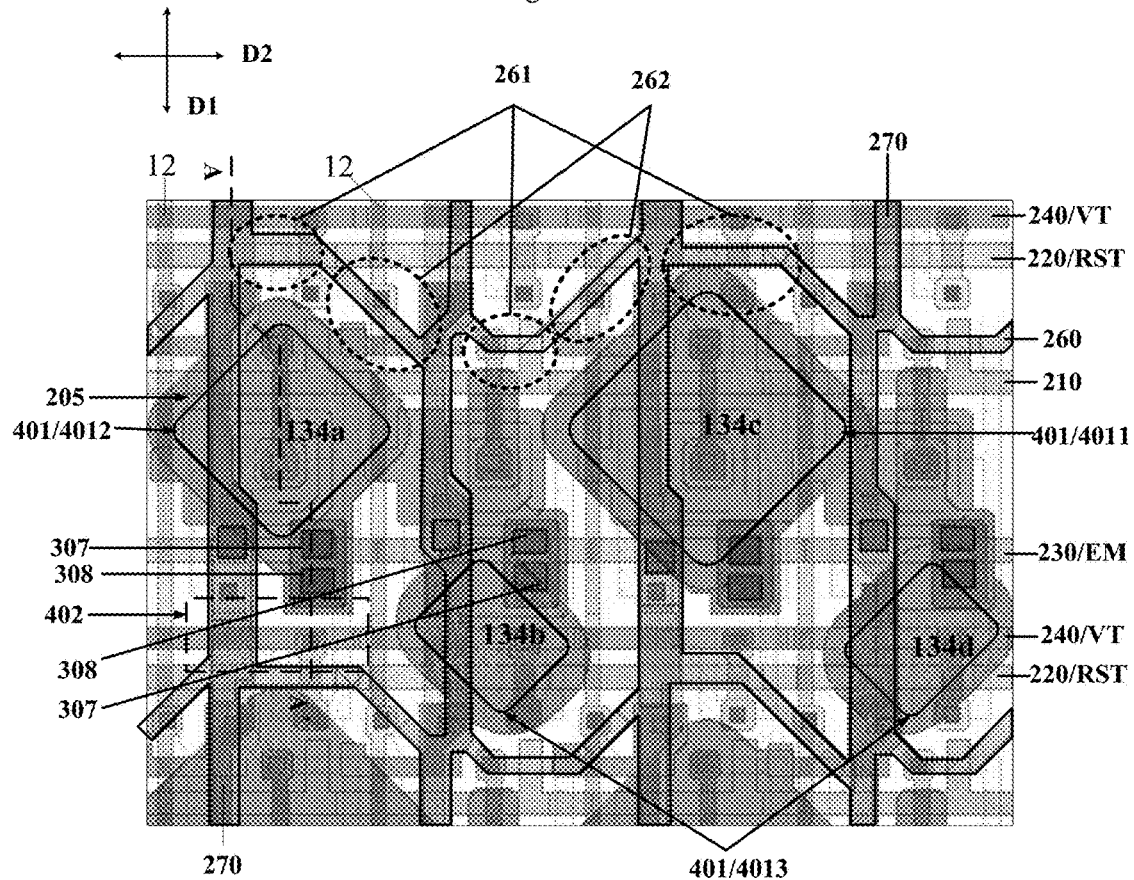

FIG. 4E also shows a fifth conductive layer 205 on the basis of FIG. 4D. The fifth conductive layer 205 includes the first electrode 134 of the light-emitting element 120. As shown in FIG. 4E, the second power lines 260 are not overlapped in the direction perpendicular to the base substrate 101. This setting can avoid the first electrode 134 of the light-emitting element from being uneven due to overlapping with the second power line 260. The light-emitting layer of the light-emitting element 120 is directly formed on the first electrode 134 and an effective light-emitting region (opening region) is formed. The flatness of the first electrode 134 will directly affect the light-emitting efficiency of the light-emitting layer and then affect the light-emitting performance of the light-emitting element 120.

For instance, the second power line 260 may be a curved structure so as to be adapted to a pattern of the first electrode 134. For instance, two adjacent second power lines 260 define one row of subpixels 100. For instance, as shown in FIG. 4, the second power line 260 includes first portions 261 and second portions 262 which are alternately connected. The extension directions of the first portions 261 are parallel to each other and parallel to the second direction D2, and the extension directions of the second portions 262 are intersected with both the first direction D1 and the second direction D2. For instance, each column of subpixels respectively correspond to one first portion 261.

FIG. 4E shows first electrodes 134a, 134b, 134c and 134d of four adjacent subpixels, and subsequently, a pixel defining layer is formed on the first electrodes 134a, 134b, 134c and 134d. Moreover, a plurality of openings in the pixel defining layer respectively expose these first electrodes. Corresponding to FIG. 1A, the first opening 4011 exposes the first electrode 134c. At this point, a shape of the first opening 4011 may be the same with or similar to a shape of the first electrode 134c, and a size of the first opening 4011 may be slightly smaller than a size of the first electrode 134c, so an orthographic projection of the first opening 4011 on the base substrate 101 is completely located within an orthographic projection of the first electrode 134c on the base substrate 101. Correspondingly, the second opening 4012 exposes the first electrode 134a; a shape of the second opening 4012 may be the same with or similar to a shape of the first electrode 134a; and a size of the second opening 4012 may be slightly smaller than a size of the first electrode 134a, so an orthographic projection of the second opening 4012 on the base substrate 101 is completely located within an orthographic projection of the first electrode 134a on the base substrate 101. The shape of the two third openings 4013 may be respectively the same with or similar to the shape of the first electrode 134b and the shape of the first electrode 134d, and the size of the two third openings 4013 may be slightly smaller than the sizes of the first electrode 134b and the first electrode 134d, so that orthographic projections of the two third openings 4013 are respectively and completely located within orthographic projections of the first electrode 134b and the first electrode 134d on the base substrate 101.

For instance, the light-emitting layer and the second electrode are respectively formed on the first electrodes 134a, 134b, 134c and 134d, so as to form light-emitting elements of a first subpixel 100a, a second subpixel 100b, a third subpixel 100c and a fourth subpixel 100d. The first subpixel 100a, the second subpixel 100b, the third subpixel 100c and the fourth subpixel 100d form a repeat unit of the display substrate.

For instance, in each repeat unit, a color of light emitted by a light-emitting element of the second subpixel 100b is the same with a color of light emitted by a light-emitting element of the fourth subpixel 100d, that is to say, the second subpixel 100b and the fourth subpixel 100d are subpixels of the same color. For instance, the second subpixel 100b and the fourth subpixel 100d are subpixels of sensitive color. When the display substrate adopts RGB display mode, the above sensitive color is green, namely both the second subpixel 100b and the fourth subpixel 100d are green subpixels. For instance, the first subpixel 100a may be a red subpixel and the third subpixel 100c may be a blue subpixel.

For instance, four subpixels in each repeat unit may form two virtual pixels. The first subpixel 100a and the third subpixel 100c in the repeat unit are respectively shared by the two virtual pixels. Subpixels in a plurality of repeat units form a pixel array. In a row direction of the pixel array, a density of the subpixels is 1.5 times a density of the virtual pixels. In a column direction of the pixel array, a density of the subpixels is 1.5 times a density of the virtual pixels. For instance, the second subpixel 100b and the fourth subpixel 100d respectively belong to two virtual pixels.

It should be noted that firstly, as the first subpixel 100a and the third subpixel 100c are shared by two adjacent virtual pixels, a boundary of each virtual pixel is not also very clear, so a shape of each virtual pixel is not limited in the embodiment of the present disclosure; and secondly, a division of the virtual pixel is relevant to the driving mode, and the specific dividing mode of the virtual pixel may be determined according to actual driving mode. No specific limitation will be given here in the present disclosure.

For instance, a shape and a size of a plurality of opening regions corresponding to the subpixels 100 may change according to the light-emitting efficiency, the service life and the like of the light-emitting layers that emits light of different colors. For instance, an opening region corresponding to a light-emitting layer with relatively short light-emitting service life may be set to be large, so as to improve the light-emitting stability. For instance, sizes of openings of the blue subpixel, the red subpixel and the green subpixel may be sequentially reduced. As the opening region is disposed on the first electrode 134, correspondingly, as shown in FIG. 4, areas of the first electrodes 134a, 121b, 121c and 121d of the first subpixel 100a, the second subpixel 100b, the third subpixel 100c and the fourth subpixel 100d are sequentially reduced.

For instance, two adjacent rows of repeat units are arranged to be shifted ½ pitch along a row direction, and the pitch indicates a distance between centers of two first subpixels 100a in two repeat units adjacent to each other along the row direction. It should be noted that the pitch may also indicate a distance between centers of two third subpixels 100c in two repeat units adjacent to each other along the row direction. The above center may be the geometric center of the subpixel. Of course, the embodiment of the present disclosure includes but not limited thereto. Two adjacent rows of repeat units may also be shifted other distances, or not shifted.

For instance, in two adjacent rows of repeat units, the first subpixel and the third subpixel in two adjacent repeat units along the column direction are exchanged in position, and the second subpixel and the fourth subpixel correspond to each other in position.

For instance, the first subpixels and the third subpixels are alternately arranged in a row or a column along the row and column directions, and the second subpixels and the fourth subpixels are arranged in a row or a column along the row and column directions. The rows formed by the first subpixels and the third subpixels and the rows formed by the second subpixels and the fourth subpixels are alternately arranged in the column direction. The columns formed by the first subpixels and the third subpixels and the columns formed by the second subpixels and the fourth subpixels are alternately arranged in the row direction. In a matrix formed by the first subpixels and the third subpixels, two first subpixels and two third subpixels that are distributed in two rows and two columns to form a 2*2 matrix respectively cover vertexes of one virtual rectangle, and one second subpixel or one fourth subpixel are located within the virtual rectangle, wherein two first subpixels cover two vertex angles on one diagonal of the virtual rectangle, and two third subpixels cover two vertex angles on the other diagonal of the virtual rectangle.

For instance, as shown in FIG. 4E, the first electrodes 134 of the subpixels are electrically connected with the fourth connecting electrodes 234 by using through holes 308, so that the second electrode T5d of the fifth transistor T5 is electrically connected with the first electrode 134 of the light-emitting element 120.

As shown in FIG. 4E, a position of the at least one photo spacer 402 subsequently formed on the pixel defining layer is as shown by a dotted frame. At this point, a first orthographic projection of the photo spacer 402 on the base substrate is not overlapped with orthographic projections of the first electrodes 134a, 134b, 134c and 134d on the base substrate, and the shortest distance between the photo spacer 402 and boundaries of the first opening 4011, the second opening 4012 and the third openings 4013 directly adjacent to the photo spacer is all greater than or equal to 5 μm.

For instance, in some examples, each repeat unit is correspondingly provided with one photo spacer. The photo spacer is disposed between the third openings 4013 of two green subpixels (namely the second subpixel 100b and the fourth subpixel 100d) in each repeat unit, and no photo spacer is disposed between the third openings 4013 of two green subpixels in two adjacent repeat units. At this point, a ratio of the number of the photo spacers on the display substrate to the number of the green subpixels is 1:2.

For instance, in each repeat unit, a connecting line of centers of the third openings 4013 of the two green subpixels runs through the photo spacer 402 between the third openings 4013, and the connecting line is parallel to a length direction of the photo spacer 402. For instance, when a shape of the photo spacer 402 is rectangle, the length direction is an extension direction of a long side of the rectangle.

For instance, the length direction of the photo spacer 402 is a horizontal display direction of the display substrate, namely a horizontal direction of an image viewed by human eyes when the display substrate displays. At this point, as the green subpixels are disposed on both sides of the photo spacer 402 in the horizontal direction, when the viewer views the display substrate respectively from two sides, subpixels that may be shielded by the photo spacer 402 are the same subpixels, so no color shift phenomenon will occur when the viewer views from different sides of the display substrate.

For instance, an orthographic projection of the first portion 261 of the second power line on the base substrate is partially overlapped with the first orthographic projection of the photo spacer 402 on the base substrate, and an orthographic projection of the second portion 262 of the second power line on the base substrate is also partially overlapped with the first orthographic projection of the photo spacer 402 on the base substrate. For instance, an orthographic projection of the third power line 270 on the base substrate is also partially overlapped with the first orthographic projection of the photo spacer 402 on the base substrate. At this point, the photo spacer 402 is formed at a position where the first portion 261 and the second portion 262 of the second power line and the third power line 270 are intersected with each other.

For instance, an orthographic projection of each data line 12 on the base substrate is not overlapped with the first orthographic projection of the photo spacer 402 on the base substrate. For instance, the photo spacer 402 is formed between two adjacent data lines 12, that is, between a data line of the column of pixel circuits and a data line of the next column of pixel circuits. For instance, in FIG. 4E, the data line 12 disposed on the left of the second opening 4012 is the data line of the column of pixel circuits, and the data line 12 disposed on the right of the second opening 4012 is the data line of the next column of pixel circuits.

For instance, at least one photo spacer 402 is disposed between the light-emitting control line 230/EM (used for driving the fourth thin-film transistor T4 and the fourth thin-film transistor T5 of the row of pixel circuits) of the row of pixel circuits (e.g., one row of pixel circuit as shown in FIGS. 4A and 4B) and the reset control line 220/RST (used for driving the seventh thin-film transistor T7 of the row of pixel circuits and the sixth thin-film transistor T6 of the next row of pixel circuits) of the next row of pixel circuits, and is closer to the reset control line 220/RST.

For instance, the reset voltage line 240/VT (electrically connected with the first electrode of the seventh thin-film transistor T7 of the row of pixel circuits and the first electrode of the sixth thin-film transistor T6 of the next row of pixel circuits) of the next row of pixel circuits is also disposed between the above light-emitting control line 230/EM and the above reset control line 220/RST. At this point, a orthographic projection of at least one photo spacer 402 on the base substrate 101 is partially overlapped with an orthographic projection of the reset voltage line 240/VT on the base substrate 101.

For instance, when the first subpixel 100a, the second subpixel 100b, the third subpixel 100c and the fourth subpixel 100d form a repeat unit of the display substrate, each repeat unit may be correspondingly provided with two photo spacers 402. At this point, there is one photo spacer 402 between every adjacent second subpixel 100b and fourth subpixel 100d, and a plurality of photo spacers 402 on the display substrate are uniformly arranged as an array with a plurality of rows and a plurality of columns. Thus, the plurality of photo spacers 402 arranged in an array can isolate the display substrate from the FMM at a plurality of positions of the display substrate, so as to prevent the FMM from contacting the display substrate and scratching the display substrate.

In some embodiments, each repeat unit may also be correspondingly provided with one photo spacer, namely a case as shown in FIGS. 1A, 1B and 4E. At this point, the plurality of photo spacers 402 are uniformly distributed on the display substrate in a staggered form. For instance, a photo spacer disposed in the odd row and a photo spacer disposed in the even row are shifted ½ pitch, and one pitch refers to a distance of two adjacent photo spacers in each row of photo spacers. Or every two repeat units may also be correspondingly provided with one photo spacer. Or every four repeat units (the four repeat units are, for example, arranged in a 2×2 array) may also be correspondingly provided with one photo spacer. In the above arrangement, the photo spacers can show sufficient and uniform support effect.

For instance, in the examples as shown in FIG. 3 and FIGS. 4A-4F, each repeat unit is correspondingly provided with one photo spacer. At this point, a ratio of the number of the photo spacers 402 on the display substrate to the total number of the subpixels is roughly 1:4. For instance, in each repeat unit, an orthographic projection of the photo spacer 402 on the base substrate is overlapped with an orthographic projection of a region where a pixel circuit of a red subpixel (namely a region of a pixel circuit of the subpixel 100a as shown by a dotted frame) is located on the base substrate. At this point, a ratio of the number of the photo spacers 402 on the display substrate to the number of the red subpixels is roughly 1:1. It should be noted that the above proportional relationship is defined according to a central region of a display region. As for a portion of an edge region, considering the design of a peripheral structure or redundant pixels, in some positions, the photo spacer may not be disposed, or a position and the number of the photo spacer may be adjusted, or a position and the number of subpixels may be adjusted. Thus, the above proportional relationship may fluctuate, for example, may fluctuate within 10%.

Figure 5:
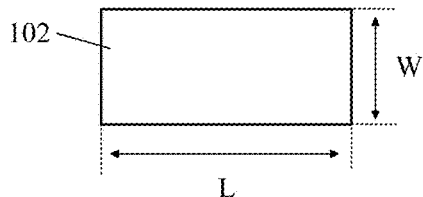
FIG. 5 is a schematic plan view of a photo spacer in a display substrate provided by at least one embodiment of the present disclosure.

For instance, as shown in FIG. 4E, a shape of the orthographic projection of the photo spacer 402 on the base substrate 101 may be rectangle. As shown in FIG. 5, a length L of the rectangle may be 20 μm-30 μm, for example, 22 μm, 25 μm or 28 μm, and a width W of the rectangle may be 10 μm-16 μm, for example, 12 μm or 15 μm. At this point, a center O of the first orthographic projection of the photo spacer 402 on the base substrate 101 is a center of the rectangle.

For instance, in other examples, a shape of the first orthographic projection of the photo spacer 402 on the base substrate 101 may also be circle, ellipse, triangle or other polygons. At this point, the center O of the first orthographic projection of the photo spacer 402 on the base substrate 101 is a center of the circle or the ellipse or the center of gravity of the triangle or other polygons. Of course, in some examples, the shape of the first orthographic projection of the photo spacer 402 on the base substrate 101 may also be an irregular pattern. At this point, the center O of the first orthographic projection of the photo spacer 402 on the base substrate 101 is the center of gravity of the irregular pattern.

For instance, in some embodiments, a height of the photo spacer 402 may be 0.8 μm-1.5 μm, for example, 1 μm or 1.2 μm. Thus, the photo spacer 402 can sufficiently isolate the FMM from the display substrate to prevent the FMM from contacting the display substrate and scratching the display substrate.

For instance, a material of the photo spacer 402 may be polyimide (PI). As PI is a photosensitive material and may be taken as a photoresist material, in the manufacturing process, the photo spacer 402 may be directly formed by exposure process and development process.

Figure 4F:
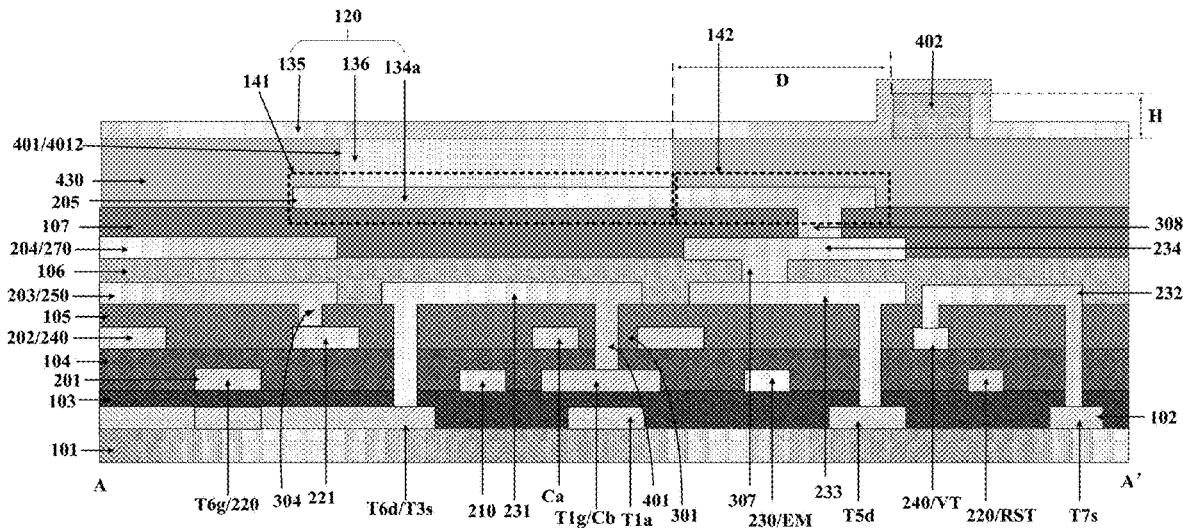
FIG. 4F is a schematic cross-sectional view of the display substrate in FIG. 4E along A-A'.

FIG. 4F is a schematic cross-sectional view of the display substrate in FIG. 4E along A-A'. As shown in FIG. 4F, the semiconductor layer 102, a first insulating layer 103, the first conductive layer 201, a second insulating layer 104, the second conductive layer 202, a third insulating layer 105, the third conductive layer 203, a fourth insulating layer 106, the fourth conductive layer 204, a fifth insulating layer 107, and the fifth conductive layer 205 are sequentially disposed on the base substrate 101 to form a structure of the display substrate as shown in FIG. 4E.

For instance, as shown in FIG. 4F, the display substrate further comprises a pixel defining layer 430 disposed on the first electrode 134a of the light-emitting element 120. An opening 401 (namely a second opening 4012 in the cross-sectional view) is formed in the pixel defining layer 430 to define a light-emitting region of one subpixel. A light-emitting layer 136 is formed in the opening 401, and a second electrode 135 is formed on the light-emitting layer 136 to form the light-emitting element 120. For instance, the second electrode 135 is a common electrode and is arranged in the display substrate in an entire surface manner.

As shown in FIG. 4F, the photo spacer 402 is disposed on the pixel defining layer, and the first orthographic projection of the photo spacer 402 on the base substrate 101 is located between the second orthographic projection of the light-emitting control line 230/EM on the base substrate 101 and the third orthographic projection of the reset control line 220/RST on the base substrate 101, and is closer to the third orthographic projection. The reset voltage line 240/VT is disposed between the light-emitting control line 230/EM and the reset control line 220/RST, and the orthographic projection of the photo spacer 402 on the base substrate 101 is overlapped with the orthographic projection of the reset voltage line 240/VT on the base substrate 101. In addition, the first orthographic projection of the photo spacer 402 on the base substrate 101 is not overlapped with the orthographic projection of the first electrode 134a on the base substrate 101, and the shortest distance D between the photo spacer 402 and the boundary of the opening 401 (the second opening 4012) directly adjacent to the photo spacer is all greater than or equal to 5 μm.

For instance, in the above display substrate, the base substrate 101 may be a rigid substrate such as a glass substrate or a silicon substrate and may also be made from flexible materials with superior heat resistance and durability, e.g., polyimide (PI), polycarbonate (PC), polyethylene terephthalate (PET), polyethylene, polyacrylate, polyarylate, polyetherimide, polyethersulfone, polyethylene terephthalate (PET), polyethylene (PE), polypropylene (PP), polysulfone (PSF), polymethyl methacrylate (PMMA), cellulose triacetate (TAC), cyclic olefin polymer (COP) and cyclic olefin copolymer (COC).

For instance, the material of the semiconductor layer 102 includes but not limited to silica-base materials (amorphous silicon (a-Si), polysilicon (p-Si), etc.), metal oxide semiconductors (indium gallium zinc oxide (IGZO), zinc oxide (ZnO), aluminum-doped zinc oxide (AZO), indium zinc tin oxide (IZTO), etc.) and organic materials (hexathiophene, polythiophene, etc.).

For instance, the materials of the first to fourth conductive layers may include gold (Au), silver (Ag), copper (Cu), aluminum (Al), molybdenum (Mo), magnesium (Mg), tungsten (W) and alloy materials composed of the above metals; or conductive metal oxide materials such as indium tin oxide (ITO), indium zinc oxide (IZO), zinc oxide (ZnO), aluminum-doped zinc oxide (AZO), etc.

For instance, the light-emitting element 120 is a top-emission structure; the first electrode 134 has reflectivity; and the second electrode 135 has transmittance or semi-transmittance. For instance, the first electrode 134 takes a material with high work function as an anode, for example, being an ITO/Ag/ITO stack structure; and the second electrode 135 takes a material with low work function, for example, semi-transmissive metal or metal alloy material, e.g., Ag/Mg alloy material, as a cathode.

For instance, the first insulating layer 103, the second insulating layer 104 and the third insulating layer 105 are, for example, inorganic insulating layers, e.g., oxide, nitride or oxynitride of silicon such as silicon oxide, silicon nitride and silicon oxynitride, or insulating materials including metal oxynitride such as aluminum oxide and titanium nitride. For instance, the fourth insulating layer 106, the fifth insulating layer 107 and a pixel defining layer 108 include organic insulating materials, e.g., organic insulating materials such as PI, acrylate, epoxy resin or PMMA. For instance, the fourth insulating layer 106 and the fifth insulating layer 107 are planarization layers. For instance, one inorganic insulating layer, for example, a passivation layer, e.g., oxide, nitride or oxynitride of silicon such as silicon oxide, silicon nitride or silicon oxynitride, or insulating materials including metal oxynitride such as aluminum oxide or titanium nitride, may also be disposed between the fourth insulating layer 106 and the third conductive layer.

In the manufacturing process of the above display substrate, as the first orthographic projection of the photo spacer 402 on the base substrate 101 is located between the second orthographic projection of the first signal line on the base substrate 101 and the third orthographic projection of the second signal line on the base substrate 101, that is, the first orthographic projection of the photo spacer 402 on the base substrate 101 does not exceed the range defined by the second orthographic projection of the first signal line on the base substrate 101 and the third orthographic projection of the second signal line on the base substrate 101. Therefore, in the process of manufacturing the photo spacer 402, positions of the first signal line and the second signal line may be taken as reference to precisely position a forming position of the photo spacer 402.

For instance, in some embodiments, a distance from a center O of the first orthographic projection of the photo spacer 402 on the base substrate 101 to a central axis EM0 of the second orthographic projection of the first signal line (e.g., the light-emitting control line EM) on the base substrate 101 is greater than a distance from the center O of the first orthographic projection to a central axis RST0 of the third orthographic projection of the second signal line (e.g., the reset control line RST) on the base substrate 101. At this point, the photo spacer 402 is closer to the second signal line relative to the first signal line and the second signal line. As the relative position of the pixel circuit and the plurality of openings in the pixel defining layer is determined, when the photo spacer 402 is closer to the second signal line, a distance between any point at the bottom of the photo spacer 402 contacting the pixel defining layer and side walls of upper surfaces of the plurality of openings 401 can be guaranteed to be greater than or equal to 5 μm, and a distance between the photo spacer 402 and the plurality of openings 401 is closer or basically the same.

At least one embodiment of the present disclosure provides a display device, which comprises any foregoing display substrates. The display device may be: any product or component with display function such as a mobile phone, a tablet computer, a television, a display, a notebook computer, a digital album or a navigator.

Figure 6:
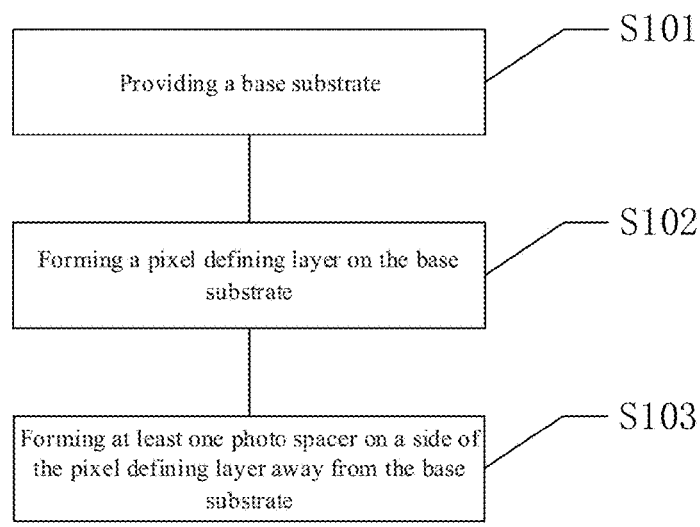
FIG. 6 is a flowchart of a method for manufacturing a display substrate provided by at least one embodiment of the present disclosure.

At least one embodiment of the present disclosure provides a method for manufacturing a display substrate. As shown in FIG. 6, the method comprises steps S101-S103.

S101: providing a base substrate.

Figure 7:
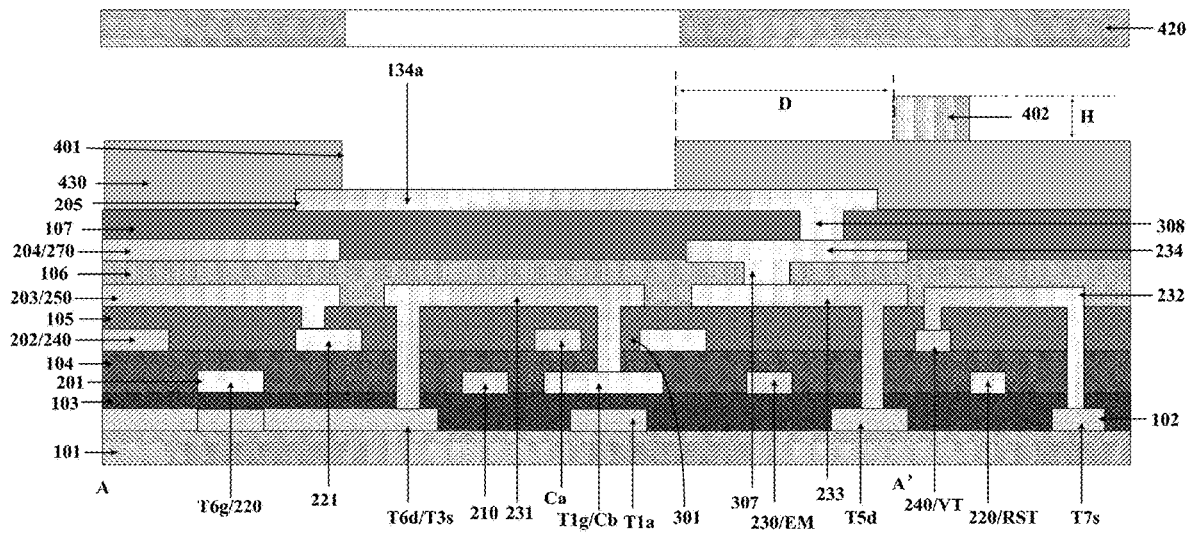
FIG. 7 is a schematic cross-sectional view of a display substrate provided by at least one embodiment of the present disclosure in a manufacturing process.

For instance, as shown in FIG. 7, the provided base substrate 101 may be various types of substrates such as a glass substrate or a silicon substrate. No limitation will be given here in the embodiment of the present disclosure.

For instance, a stack layer (not shown in the figure) of a barrier layer and a buffer layer may be formed on the base substrate 101, so as to prevent impurities in the base substrate 101 from entering functional layers to be formed subsequently such as the pixel circuit structure.

For instance, the pixel circuit structure is formed on the stack layer of the barrier layer and the buffer layer and includes a pixel circuit for driving the display panel to display. As described above, the pixel circuit may be a 2T1C driving circuit, a 3T1C driving circuit, a 7T1C driving circuit, etc. The type and the forming method of the driving circuit are not limited in the embodiment of the present disclosure.

For instance, FIG. 7 is a schematic partial cross-sectional view of the display substrate in the manufacturing process. With reference to FIGS. 4A-4E and FIG. 7, forming pixel circuit structure includes forming a plurality of thin-film transistors, a storage capacitor, and the first electrode 134a of the light-emitting element 120 on the stack layer of the barrier layer and the buffer layer. The manufacturing method of the pixel circuit structure will be described in detail below. For instance, the manufacturing method of the pixel circuit structure includes steps S11-S22.

S11: forming a semiconductor material layer on the base substrate, and performing a patterning process on the semiconductor material layer to form a semiconductor layer 102 as shown in FIG. 4A. The semiconductor layer 102 includes active layers T1a-T7a and doped region patterns (namely corresponding to source regions and drain regions of the first to seventh transistors T1-T7) of the first to seventh transistors T1-T7 in each subpixel region. Moreover, active layer patterns and the doped region patterns of the transistors in the same pixel region are integrally arranged.

It should be noted that the active layer may include an integrally formed low-temperature polysilicon layer, and a source region and a drain region therein may be subjected to a conductive treatment by using doping and the like, to realize the electrical connection between the structures. That is to say, the active semiconductor layer of the transistor of each subpixel is an overall pattern formed by p-type silicon, and the transistor in the same pixel region includes the doped region pattern (namely the source region and the drain region) and the active layer pattern, and the active layers of different transistors are spaced from each other by a doped structure.

S12: forming the first insulating layer 103 (for example, may be a transparent layer), e.g., a gate insulation layer, on the semiconductor layer 102, and forming a plurality of first insulating layer through holes in the first insulating layer for connecting to a pattern of a subsequently formed third conductive layer 203. For instance, corresponding first insulating layer through holes, for example, a through hole 402, a through hole 405, a through hole 303, a through hole 305 and the like that run through the first insulating layer, are respectively formed in the first insulating layer at positions corresponding to the source region and the drain region in the semiconductor layer, that is, the first insulating layer through holes are respectively overlapped with the source region and the drain region in the semiconductor layer, so that the source region and the drain region can be electrically connected with structures such as a data line 12 in the third conductive layer, a first power line 250, a first connecting electrode 231, a second connecting electrode 232, and a third connecting electrode 233.

S13: forming a first conductive material layer on the first insulating layer, and performing a patterning process on the first conductive material layer, to form the first conductive layer 201 as shown in FIG. 4A, namely form a scanning line 210, a reset control line 220 and a light-emitting control line 230 which are insulated from each other and extended along the second direction. For instance, as for one row of pixel circuits, the reset control line 220, the scanning line 210 and the light-emitting control line 230 correspondingly connected with the pixel circuits are sequentially arranged along the first direction.

For instance, the first conductive layer 201 also includes the gate electrodes T1g-T7g of the first to seventh transistors T1-T7. For instance, the gate electrode T6g of the sixth transistor T6 and the reset control line 220 are an integral structure, namely a portion of the reset control line 220 is taken as the gate electrode T6g of the sixth transistor T6; the gate electrode T2g of the second transistor T2 and the scanning line 210 are an integral structure, namely a portion of the scanning line 210 is taken as the gate electrode T2g of the second transistor T2; the gate electrode T4g of the fourth transistor T4 and the gate electrode T5g of the fifth transistor T5 are both an integral structure with the light-emitting control line 230, namely a portion of the light-emitting control line 230 is taken as the gate electrode T4g of the fourth transistor T4 and the gate electrode T5g of the fifth transistor T5; and the gate electrode T7g of the seventh transistor T7 and the reset control line 220 corresponding to the next row of pixel circuits are an integral structure. For instance, both the sixth transistor T6 and the third transistor T3 are a double-gate structure. Two gate electrodes T6g of the sixth transistor T6 are both a portion of the reset control line 220. One gate electrode of the third transistor T3 is a portion of the scanning line 210, and the other gate electrode of the third transistor T3 is a portion which is integrally connected with the scanning line 210 and protruded towards the reset control line 220.

For instance, portions of the semiconductor layer 102, that are overlapped with the first conductive layer 201 in a direction perpendicular to the base substrate, define the active layers (channel regions) T1a-T7a of the first to seventh transistors T1-T7.

For instance, in the D1 direction, the gate electrode of the second transistor (e.g., the data write transistor) T2, the gate electrode of the third transistor (e.g., a threshold compensation transistor) T3, the gate electrode of the sixth transistor (e.g., the first reset transistor) T6, and the gate electrode of the seventh transistor (e.g., the second reset transistor) T7 are all disposed at a first side of the gate electrode of the first transistor (e.g., the driving transistor) T1, and the gate electrode of the fourth transistor (e.g., the first light-emitting control transistor) T4 and the gate electrode of the fifth transistor (e.g., the second light-emitting control transistor) T5 are both disposed at a second side of the gate electrode of the first transistor T1. In a plane parallel to the base substrate, the first side of the gate electrode of the first transistor T1 in the same pixel region may be an upper side of the gate electrode of the first transistor T1, and the second side of the gate electrode of the first transistor T1 may be a lower side of the gate electrode of the first transistor T1. As for the lower side, for example, a side of the display substrate used for bonding an integrated chip (IC) is the lower side of the display substrate. The lower side of the gate electrode of the first transistor T1 is a side of the gate electrode of the first transistor T1 closer to the integrated chip. The upper side is an opposite side of the lower side, for example, is a side of the gate electrode of the first transistor T1 farther away from the IC.

For instance, in the D2 direction, both the gate electrode of the second transistor T2 and the gate electrode of the fourth transistor T4 are disposed on a third side of the gate electrode of the first transistor T1, and a first gate electrode (a gate electrode that is integral with the scanning line 210) of the third transistor T3, the gate electrode of the fifth transistor T5, and the gate electrode of the seventh transistor T7 are all disposed at a fourth side of the gate electrode of the first transistor T1. For instance, the third side and the fourth side of the gate electrode of the first transistor T1 in the same pixel region (a region in which the pixel circuit is located) are two opposite sides of the gate electrode of the first transistor T1 in the D2 direction. For instance, the third side of the gate electrode of the first transistor T1 in the same pixel region (the region in which the pixel circuit is located) may be the left side of the gate electrode of the first transistor T1, and the fourth side of the gate electrode of the first transistor T1 may be the right side of the gate electrode of the first transistor T1. The left side and the right side are, for example, in the same pixel region (the region in which the pixel circuit is located); the data line is on the left side of the first power line 250; and the first power line 250 is on the right side of the data line.

S14: as shown in FIG. 4A, performing conduction treatment (e.g., doping treatment) on the semiconductor layer 102 by adoption of the first conductive layer 201 as a mask by self-aligned process, so that a portion of the semiconductor layer 102, not covered by the first conductive layer 201, are conducted, and then a portion of the semiconductor layer 102, disposed on two sides of the active layer of the transistor, are conducted to respectively form the source regions or the drain regions of the first to seventh transistors T1-T7, namely the first electrodes (T1s-T7s) and the second electrodes (T1d-T2d) of the first to seventh transistors T1-T7.

S15: forming a second insulating layer 104 (for example, may be a transparent layer), e.g., a second gate insulation layer, on the first conductive layer 201, and at least forming a second insulating layer through hole corresponding to the first insulating layer through hole in the second insulating layer. For instance, through holes at least running through the first insulating layer and the second insulating layer correspondingly at least include a through hole 402, a through hole 405, a through hole 303, a through hole 305, etc.

S16: forming a second conductive material layer on the second insulating layer 104, and performing a patterning process on the second conductive material layer to form the second conductive layer 202 as shown in FIG. 4B, namely form a shielding electrode 221, a first capacitor electrode Ca, and the reset voltage line 240 extended along the first direction, which are insulated from each other.

For instance, the shielding electrode 221 is overlapped with the first electrode T2s of the second transistor T2 in the direction perpendicular to the base substrate 101, so as to protect a signal in the first electrode T2s of the second transistor T2 from being interfered by other signals.

For instance, the first capacitor electrode Ca is at least partially overlapped with the gate electrode T1g of the first transistor T1 in the direction perpendicular to the base substrate 101. A through hole 301 is also formed in the first capacitor electrode Ca by the patterning process. The through hole 301 exposes at least one portion of the gate electrode T1g of the first transistor T1.

S17: forming a third insulating layer 105 on the second conductive layer 202. The third insulating layer, for example, may be an interlayer insulating layer. A through hole that is connected with the subsequently formed third conductive layer is formed in the third insulating layer. At least a portion of the through holes, for example, a through hole 402, a through hole 405, a through hole 303 and a through hole 305, correspond to the first insulating layer through holes and the second insulating layer through holes in position, and meanwhile, run through the first insulating layer, the second insulating layer and the third insulating layer.

S18: forming a third conductive material layer on the third insulating layer 105, and performing a patterning process on the third conductive material layer to form the third conductive layer 203 as shown in FIG. 4C, namely form the data line 12, the first power line 250, the first connecting electrode 231, the second connecting electrode 232, and the third connecting electrode 233 that are insulated from each other. The data line 12 and the first power line 250 are extended along the first direction D1.

For instance, as shown in FIG. 4C, the data line 12 is overlapped with the first electrode T2s of the second transistor T2 in the direction perpendicular to the base substrate 101 and is electrically connected with the first electrode T2s of the second transistor T2 through the through hole 305. The through hole 305, for example, runs through the first insulating layer 103, the second insulating layer 104 and the third insulating layer 105.

For instance, as shown in FIG. 4C and FIG. 7, the first power line 250 is overlapped with the shielding electrode 221 in the direction perpendicular to the base substrate 101 and is electrically connected with the shielding electrode 221 through the through hole 304. For instance, the through hole 304 runs through the third insulating layer 105.

For instance, as shown in FIG. 4C, the first power line 250 is electrically connected with the first capacitor electrode Ca in one corresponding column of subpixels through the through hole 302 and is electrically connected with the first electrode T4s of the fourth transistor T4 through the through hole 303. For instance, the through hole 302 runs through the third insulating layer 105, and the through hole 303 runs through the first insulating layer 103, the second insulating layer 104 and the third insulating layer 105.

For instance, as shown in FIG. 4C and FIG. 7, one terminal of the first connecting electrode 231 is electrically connected with the gate electrode T1g of the first transistor T1, namely the second capacitor electrode Cb, through the through hole 301 in the first capacitor electrode Ca and the through hole 401 in the insulating layer, and the other terminal is electrically connected with the first electrode of the third transistor T3 through the through hole 402, so that the second capacitor electrode Cb is electrically connected with the first electrode T3s of the third transistor T3. For instance, the through hole 401 runs through the second insulating layer 104 and the third insulating layer 105, and the through hole 402 runs through the first insulating layer 103, the second insulating layer 104 and the third insulating layer 105.

For instance, as shown in FIG. 4C, one terminal of the second connecting electrode 232 is electrically connected with the reset voltage line through the through hole 403, and the other terminal is electrically connected with the sixth transistor T6 through the through hole 404, so that the first electrode T6s of the sixth transistor T6 can receive the first reset voltage Vinit1 from the reset voltage line 240. For instance, the through hole 403 runs through the third insulating layer 105, and the through hole 404 runs through the first insulating layer 103, the second insulating layer 104 and the third insulating layer 105.

For instance, as shown in FIG. 4C and FIG. 7, the third connecting electrode 233 is electrically connected with the second electrode T5d of the fifth transistor T5 through the through hole 405, and is configured to electrically connect the second electrode T5d of the fifth transistor T5 and the first electrode 134 of the light-emitting element. For instance, the through hole 405 runs through the first insulating layer 103, the second insulating layer 104 and the third insulating layer 105.

S19: forming a fourth insulating layer 106 on the third conductive layer 203, and forming a through hole that is configured to be connected with a subsequently formed fourth conductive layer in the fourth insulating layer. In some embodiments, for example, the fourth insulating layer 106 includes a first planarization layer. In some other embodiments, for example, the fourth insulating layer 106 includes two layers of a passivation layer and a first planarization layer, and the through hole formed in the fourth insulating layer need to run through the two layers of the passivation layer and the first planarization layer. For instance, the first planarization layer is disposed on a side of the passivation layer away from the third conductive layer.

S20: forming a fourth conductive material layer on the fourth insulating layer 106, and performing a patterning process on the fourth conductive material layer to form a fourth conductive layer 204 as shown in FIG. 4D, namely form a second power line 260, a third power line 270 and a fourth connecting electrode 234. The second power line 260 and the third power line 270 are connected with each other and are insulated from the fourth connecting electrode 234.

For instance, as shown in FIG. 4D, a plurality of third power lines 270 are extended along the first direction D1 and are respectively electrically connected with a plurality of first power lines 250 via through holes 306 in one-to-one correspondence. For instance, each third power line 270 and corresponding first power line 250 are overlapped with each other in the direction perpendicular to the base substrate 101. For instance, the through hole 306 runs through the fourth insulating layer 106.

For instance, as shown in FIG. 4D, the fourth connecting electrode 234 and the third connecting electrode 233 are overlapped with each other in the direction perpendicular to the base substrate 101, and the fourth connecting electrode 234 is electrically connected with the third connecting electrode 233 via a through hole 307 running through the fourth insulating layer 106.

S21: for instance, as shown in FIG. 7, the manufacturing method of the display substrate may further comprise forming a fifth insulating layer 107 on the fourth conductive layer 204 and forming a through hole for being connected with a subsequently formed fifth conductive layer in the fifth insulating layer 107. For instance, the fifth insulating layer 107 may be a second planarization layer. The fifth insulating layer through hole, for example, is used for connecting the drain electrode of the first transistor and the first electrode of the light-emitting element. The fifth insulating layer through hole and the drain electrode of the first transistor may be overlapped and may also be not overlapped. When not overlapped, a connecting line may be additionally arranged in the third conductive layer for connection. The connection mode is relevant to a position and a shape of the subpixel arrangement structure, for example, the first electrode.

S22: forming a fifth conductive material layer on the fifth insulating layer 107, and performing a patterning process on the fifth conductive material layer to form a fifth conductive layer 205, namely form a plurality of first electrodes 134 (134a as shown in the figure) used for forming the light-emitting elements and insulated from each other.

For instance, each first electrode 134 includes a main portion 141 and a connecting portion 142; the main portion 141 is mainly configured to drive the light-emitting layer to emit light; and the connecting portion 142 is mainly configured to be electrically connected with the pixel circuit.

For instance, as shown in FIG. 7, the connecting portion 142 is electrically connected with the fourth connecting electrode 234 through a through hole 308 in the fifth insulating layer 107. For instance, in a direction parallel to a plane of the base substrate 101, the through hole 308 is farther away from the main portion 141 of the first electrode 134, namely the opening 401 of the subpixel, compared with the through hole 307, that is, an orthographic projection of the through hole 308 on the base substrate 101 is farther away from an orthographic projection of the opening 401 on the base substrate compared with an orthographic projection of the through hole 307 on the base substrate 101.

For instance, as shown in FIG. 7, the manufacturing method of the display substrate may further comprise: forming a pixel defining layer 108 on the fifth conductive layer 205, forming the opening 401 in the pixel defining layer 108 corresponding to the main portion 141 of each first electrode 134, at least forming the light-emitting layer 136 in the opening 401, and forming the second electrode 135 on the light-emitting layer.

For instance, materials of the semiconductor material layer include but not limited to silica-base materials (amorphous silicon a-Si, polycrystalline silicon p-Si, etc.), metal oxide semiconductors (IGZO, ZnO, AZO, IZTO, etc.), and organic materials (hexathiophene, polythiophene, etc.).

For instance, materials of the first conductive material layer, the second conductive material layer, the third conductive material layer, the fourth conductive material layer, the fifth conductive material layer, and the second electrode may include Au, Ag, Cu, Al, Mo, Mg, W and alloy materials composed of the above metals; or transparent metal oxide conductive materials such as ITO, IZO, ZnO, AZO, etc.

For instance, the first insulating layer 103, the second insulating layer 104, the third insulating layer 105, the fourth insulating layer 106 and the fifth insulating layer 107 are, for example, inorganic insulating layers, e.g., oxide, nitride or oxynitride of silicon such as silicon oxide, silicon nitride or silicon oxynitride, or insulating materials including metal oxynitride such as aluminum oxide or titanium nitride. For instance, a portion of the insulating layers, e.g., the first planarization layer and the second planarization, may also be an organic material such as polyimide, acrylate, epoxy resin or PMMA. No limitation will be given here in the embodiment of the present disclosure. For instance, the fourth insulating layer 106 and the fifth insulating layer 107 may include a planarization layer.

For instance, the above patterning process may adopt the conventional photolithography process, for example, including photoresist coating, exposure, development, drying, etching, etc.

S102: forming a pixel defining layer on the base substrate.

For instance, as shown in FIG. 7, after the above pixel circuit structure is formed, a pixel defining layer 403 is formed by a patterning process. The pixel defining layer 403 includes a plurality of openings 401, and each opening 401 exposes the first electrode 134 and is configured to form the light-emitting element 120 of one subpixel.

For instance, one patterning process includes a plurality of steps such as photoresist coating, exposure, development and etching. When the patterned material is a photoresist material, one patterning process may only include steps of exposure and development.

For instance, a material of the pixel defining layer 403 may be polyimide. As polyimide may be taken as a photoresist material, the pixel defining layer provided with the plurality of openings may be formed by coating a polyimide material layer on the pixel circuit structure and then performing exposure and development on the polyimide material layer.

S103: forming at least one photo spacer on a side of the pixel defining layer away from the base substrate.

For instance, the forming the at least one photo spacer includes forming a plurality of photo spacers arranged in an array. Each photo spacer has similar forming position.

For instance, a forming position of the photo spacer is positioned at first, and then the photo spacer is formed at this position, so that distances D between any point at the bottom of the formed photo spacer contacting the pixel defining layer and side walls of upper surfaces of the plurality of openings is greater than or equal to 5 μm.

For instance, the forming position of the photo spacer may be positioned by using a plurality of methods. For instance, in one example, the forming position of the photo spacer may be positioned through a position of the plurality of openings in the pixel defining layer. Thus, the photo spacer is formed between the plurality of openings, and the distances D between any point at the bottom of the formed photo spacer contacting the pixel defining layer and the side walls of the upper surfaces of the plurality of openings is greater than or equal to 5 μm.

For instance, in one example, the pixel circuit structure formed on the display substrate includes a first signal line and a second signal line which are parallel to each other. At this point, positions of the first signal line and the second signal line may be positioned, and then the forming position of the photo spacer is positioned by taking the position of the first signal line and the second signal line as reference, so the first orthographic projection of the formed photo spacer on the base substrate is located between a second orthographic projection of the first signal line on the base substrate and a third orthographic projection of the second signal line on the base substrate.

For instance, in the manufacturing process, the position of the first signal line and the second signal line may be scanned by adoption of an optical detection device, and subsequently, the forming position of the photo spacer is set by taking the position of the first signal line and the second signal line as reference, and then a position of a mask used for forming the photo spacer is set, so that the photo spacer formed by utilization of the mask is disposed at the above set position.

For instance, as described above, the first signal line may be the light-emitting control signal line 230/EM, and the second signal line may be the reset signal line 220/RST.

For instance, after positioning, a distance from a center of the first orthographic projection of the photo spacer on the base substrate to a central axis of the second orthographic projection of the first signal line on the base substrate is greater than a distance from the center of the first orthographic projection to a central axis of the third orthographic projection of the second signal line on the base substrate, namely the photo spacer is closer to the second signal line between the first signal line and the second signal line.

For instance, a material of the photo spacer may be polyimide. As polyimide may be taken as photoresist material, at this point, as shown in FIG. 7, forming the photo spacer 402 includes: forming a polyimide material layer on a side of the pixel defining layer 403 away from the base substrate 101, and forming the photo spacer 402 by performing exposure and development on the polyimide material layer via a mask. For instance, when a required height H of the photo spacer is 0.8 µm-1.5 µm, a forming thickness of the polyimide material layer is 0.8 µm-1.5 µm, e.g., 1 µm or 1.2 µm.

For instance, the material of the photo spacer may be the same with the material of the pixel defining layer. For instance, the photo spacer may be integrally formed with the pixel defining layer. For instance, the photo spacer and the pixel defining layer are formed by one patterning process via a halftone mask.

It should be noted that each subpixel includes a pixel circuit structure and a light-emitting element, and a portion of the light-emitting element disposed in an opening of the pixel defining layer is an actual light-emitting region. In the embodiment of the present disclosure, in the overlapping relationship between the photo spacer and the pixel circuit structure, for example, the positional relationship with the signal lines is described by taking the pixel circuit region which is a region as shown by the dotted frame in FIG. 4B as an example, and the positional relationship between the photo spacer and the first electrode of the subpixel or the opening of the pixel defining layer is described by taking a actual position and a coverage region of the first electrode or the opening of the pixel defining layer as an example.

For instance, as shown in FIG. 4, a shape of the orthographic projection of the photo spacer 402 on the base substrate 101 is rectangle. A length L of the rectangle may be 20 µm-30 µm, e.g., 22 µm, 25 µm or 28 µm. A width D of the rectangle may be 10 µm-16 µm, e.g., 12 µm or 15 µm. For instance, in other embodiments, the shape of the first orthographic projection of the photo spacer 402 on the base substrate 101 may also be circle, ellipse, triangle or other polygons. The specific shape of the photo spacer 402 is not limited in the embodiment of the present disclosure.

For instance, as shown in FIG. 7, after the photo spacer 402 is formed, the light-emitting layer 136 may be formed in the plurality of openings 401 of the pixel defining layer 403 through a mask 420 (such as an FMM) by methods such as inkjet printing or evaporation. The light-emitting layer 136 at least covers the opening of the pixel defining layer and may also cover a portion of a surface of the pixel defining layer away from the base substrate, to ensure that the light-emitting layer disposed in the opening is more uniform and more reliable. In the process of arranging the mask 420, a setting distance between the photo spacer 402 and the mask 420 tends to be close. Due to the reasons such as gravity, the photo spacer 420 may contact a central portion of the mask 420. At this point, the photo spacer 402 may have the function of supporting the mask 420, so as to avoid the mask 420 from scratching the functional structures that have been formed on the display substrate.

Figure 8:
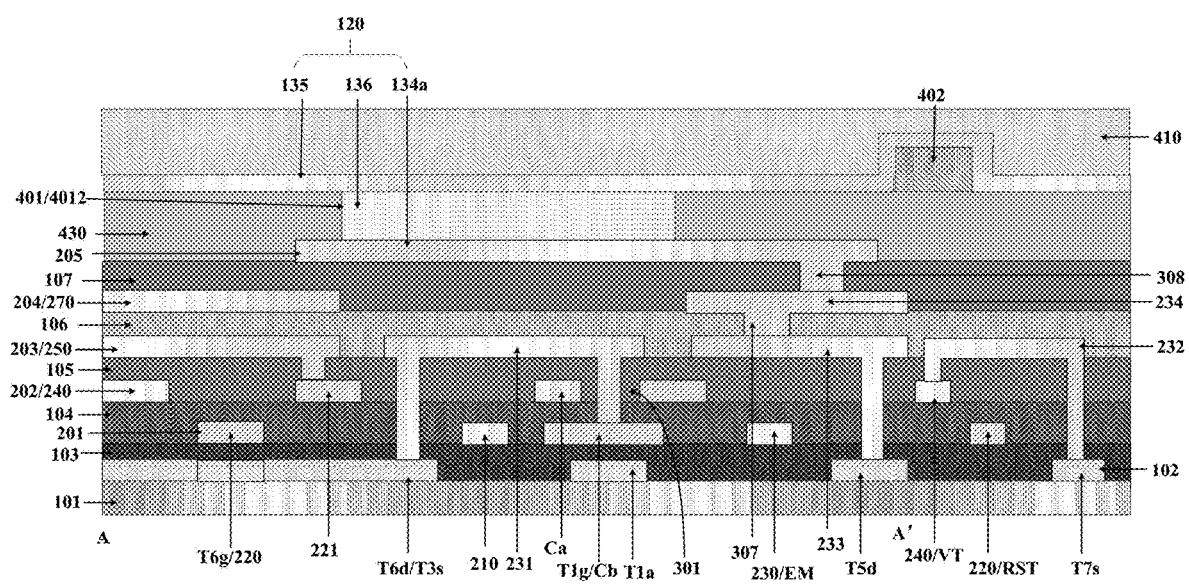
FIG. 8 is another schematic cross-sectional view of a display substrate provided by at least one embodiment of the present disclosure in a manufacturing process.

As shown in FIG. 8, after the light-emitting layer 136 is formed, a second electrode 135 is formed on the light-emitting layer 136 by methods such as sputtering. For instance, the second electrode 135 may be entirely formed on the display substrate in an entire surface manner. Subsequently, an encapsulation layer 410 is formed on the second electrode 135 to encapsulate and protect the display substrate.

For instance, the encapsulation layer 410 may include a plurality of encapsulation sublayers, e.g., stack layers of a plurality of inorganic insulating sublayers and organic insulating sublayers. For instance, a material of the inorganic encapsulation sublayer includes an inorganic material such as silicon oxide, silicon nitride or silicon oxynitride, and a material of the organic encapsulation sublayer includes an organic material such as resin or polyimide. Wherein, the inorganic insulating sublayer may be formed by methods such as deposition, and the organic encapsulation sublayer may be formed by methods such as coating.

For instance, other structures such as a transparent cover plate may also be covered on the display substrate. Other structures of the display substrate are not specifically limited in the embodiment of the present disclosure.

In the process of manufacturing the display substrate in the manufacturing method provided by the embodiment of the present disclosure, due to designs of a position, a shape, a size and the like of the photo spacer, the photo spacer can have full supporting function on the mask (such as the FMM) arranged thereon, so as to avoid the mask from scratching other functional structures that have been formed on the display substrate. Therefore, the display substrate obtained by utilization of the manufacturing method has better reliability.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged, that is, the accompanying drawings are not drawn according to the actual scale. However, it should understood that, in the case in which a component or element such as a layer, film, region, substrate or the like is referred to be "on" or "under" another component or element, it may be directly on or under the another component or element or a component or element is interposed therebetween.

(3) In case of no conflict, features in one embodiment or in different embodiments can be combined to obtain a new embodiment.

What are described above is related to the specific embodiments of the disclosure only and not limitative to the scope of the disclosure. The protection scope of the disclosure shall be based on the protection scope of the claims.

The invention claimed is:

1. A display substrate, comprising:
   a base substrate;
   a pixel defining layer, disposed on the base substrate and including a plurality of openings; and
   at least one photo spacer, disposed on a side of the pixel defining layer away from the base substrate, wherein wherein the display substrate further comprises:

a pixel circuit structure, disposed between the base substrate and the pixel defining layer and including a first signal line and a second signal line which are extended along a second direction, the pixel circuit structure also includes a power line, a first orthographic projection of the at least one photo spacer on the base substrate is partially overlapped with an orthographic projection of the power line on the base substrate.

2. The display substrate according to claim 1, wherein the power line includes a plurality of first portions and a plurality of second portions which are alternately connected;

the plurality of first portions are parallel to each other, and an extension direction of the plurality of first portions is identical with an extension direction of the first signal line and the second signal line, an extension direction of the second portion is intersected with the extension direction of the first portion;

an orthographic projection of the first portion on the base substrate is partially overlapped with the first orthographic projection; and an orthographic projection of the second portion on the base substrate is partially overlapped with the first orthographic projection.

3. The display substrate according to claim 2, wherein the first orthographic projection of the at least one photo spacer on the base substrate is located between a second orthographic projection of the first signal line on the base substrate and a third orthographic projection of the second signal line on the base substrate.

4. The display substrate according to claim 3, wherein the first signal line is a light-emitting control signal line, and the second signal line is a reset signal line.

5. The display substrate according to claim 4, wherein a distance from a center of the first orthographic projection to a central axis of the second orthographic projection is greater than a distance from the center of the first orthographic projection to a central axis of the third orthographic projection.

6. The display substrate according to claim 1, wherein the at least one photo spacer includes a plurality of photo spacers arranged in a plurality of rows and a plurality of columns; the pixel circuit structure includes a plurality of pixel circuits arranged in a plurality of rows and a plurality of columns; each row of pixel circuits share one light-emitting control signal line and one reset signal line; and orthographic projections of one row of photo spacers is located between an orthographic projection of the light-emitting control signal line of one row of pixel circuits on the base substrate and an orthographic projection of the reset signal line of a next row of pixel circuits on the base substrate.

7. The display substrate according to claim 6, wherein in each row of pixel circuits, every four adjacent pixel circuits are correspondingly provided with one photo spacer.

8. The display substrate according to claim 1, wherein the at least one photo spacer includes a plurality of photo spacers arranged in a plurality of rows and a plurality of columns; and a plurality of photo spacers disposed in an odd row and a plurality of photo spacers disposed in an even row are shifted ½ pitch.

9. The display substrate according to claim 8, wherein the plurality of openings includes a first opening for a blue subpixel, a second opening for a red subpixel, and a third opening for a green subpixel; and sizes of the first opening, the second opening and the third opening are reduced gradually.

10. The display substrate according to claim 9, wherein by taking one blue subpixel, one red subpixel and two green subpixels as one repeat unit, the display substrate comprises a plurality of repeat units arranged in a plurality of rows and a plurality of columns; each repeat unit is correspondingly provided with one photo spacer;

in each repeat unit, the third openings of the two green subpixels are arranged along a row direction; the first opening of the blue subpixel and the third opening of the red subpixel are arranged along a column direction; and the photo spacer is surrounded by the third openings of the two green subpixels, the first opening of the blue subpixel, and the third opening of the red subpixel.

11. The display substrate according to claim 10, wherein a connecting line of centers of the third openings of the two green subpixels in each repeat unit runs through the photo spacer, and the connecting line is parallel to a length direction of the photo spacer, wherein the length direction of the photo spacer is a horizontal display direction of the display substrate.

12. The display substrate according to claim 10, wherein an orthographic projection of the photo spacer on the base substrate is overlapped with an orthographic projection of a region in which a pixel circuit of the red subpixel is located on the base substrate.

13. The display substrate according to claim 1, wherein a height of the at least one photo spacer is 0.8 μm-1.5 μm.

14. The display substrate according to claim 1, wherein a shape of an orthographic projection of the at least one photo spacer on the base substrate is rectangle, wherein a length of the rectangle is 20 μm-30 μm, and a width of the rectangle is 10 μm-16 μm.

15. The display substrate according to claim 1, wherein a distance from any point at a bottom of the at least one photo spacer contacting the pixel defining layer to an upper edge of a side wall of the plurality of openings is greater than or equal to 5 μm.

16. The display substrate according to claim 1, wherein an extending direction of the power line is the second direction.

17. The display substrate according to claim 1, wherein the plurality of openings include a first opening, a second opening and a third opening, and sizes of the first opening, the second opening and the third opening are reduced gradually; in a first direction, the first opening and the second opening are respectively disposed on two sides of the at least one photo spacer; and in a second direction perpendicular to the first direction, the third openings are disposed on two sides of the at least one photo spacer.

18. The display substrate according to claim 17, wherein a blue light-emitting layer is disposed in the first opening; a red light-emitting layer is disposed in the second opening; and a green light-emitting layer is disposed in the third opening, wherein a shape of the first opening is a first square, a shape of the second opening is a second square, and a side length of the first square is greater than a side length of the second square.

19. The display substrate according to claim 18, wherein a shape of the third opening is rectangle, a long side of the rectangle is parallel to the side length of the first square of the first opening which is adjacent to the third opening, and a short side of the rectangle is parallel to the side length of the second square of the second opening which is adjacent to the third opening.

20. A display device, comprising the display substrate according to claim 1.

* * * * *